United States Patent
Kim et al.

(10) Patent No.: US 12,547,032 B2
(45) Date of Patent: Feb. 10, 2026

(54) DISPLAY DEVICE

(71) Applicant: LG ELECTRONICS INC., Seoul (KR)

(72) Inventors: Seho Kim, Seoul (KR); Kuenyoung Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 88 days.

(21) Appl. No.: 18/664,034

(22) Filed: May 14, 2024

(65) Prior Publication Data

US 2025/0004326 A1    Jan. 2, 2025

(30) Foreign Application Priority Data

Jun. 30, 2023    (KR) .................. 10-2023-0085216

(51) Int. Cl.
*G02F 1/13357*    (2006.01)

(52) U.S. Cl.
CPC .. *G02F 1/133605* (2013.01); *G02F 1/133608* (2013.01); *G02F 2202/28* (2013.01)

(58) Field of Classification Search
CPC ........ G02F 1/133605; G02F 1/133608; G02F 2202/28; G02F 1/133603; G02F 1/133553; G02F 1/133314; G02F 1/133606

See application file for complete search history.

(56) References Cited

U.S. PATENT DOCUMENTS

| | | | |
|---|---|---|---|
| 2007/0103908 A1* | 5/2007 | Tabito | G02F 1/133608 362/240 |
| 2008/0180593 A1* | 7/2008 | Cho | G02F 1/133604 349/58 |
| 2016/0138779 A1* | 5/2016 | Oh | G02F 1/133611 362/97.1 |
| 2019/0265539 A1 | 8/2019 | Oshima | |

FOREIGN PATENT DOCUMENTS

| | | |
|---|---|---|
| KR | 10-2022-0158359 A | 12/2022 |
| KR | 10-2023-0003941 A | 1/2023 |
| WO | WO2022/215830 A1 | 10/2022 |

* cited by examiner

*Primary Examiner* — Kevin Quarterman
(74) *Attorney, Agent, or Firm* — Birch, Stewart, Kolasch & Birch, LLP

(57) ABSTRACT

A display device including a display panel; a frame disposed at a rear of the display panel; a substrate disposed between the display panel and the frame, the substrate being coupled to the frame; light sources disposed on the substrate; and a reflective sheet covering the substrate and having holes, the holes corresponding to the light sources, wherein the reflective sheet comprises: a first reflective sheet including first holes and a protruding portion protruding from one side of the first reflective sheet including some of the first holes; a second reflective sheet having second holes; a third reflective sheet having third holes; and a fourth reflective sheet having fourth holes and having a same shape as the third reflective sheet, wherein the second reflective sheet is identical to the first reflective sheet except for the protruding portion.

20 Claims, 29 Drawing Sheets

DISPLAY DEVICE

CROSS-REFERENCE TO RELATED APPLICATION

This application claims priority to Korean Patent Application No. 10-2023-0085216, filed in the Republic of Korea on Jun. 30, 2023, the entire contents of which are hereby expressly incorporated by reference into the present application.

BACKGROUND OF THE INVENTION

Field of the Invention

The present disclosure relates to a display device.

Description of the Related Art

Various display devices, such as a liquid crystal display (LCD) device, a plasma display panel (PDP), an electroluminescent display (ELD), a vacuum fluorescent display (VFD), etc., have been studied and used recently. Among these devices, the LCD panel includes a TFT substrate and a color substrate which are positioned opposite each other with a liquid crystal layer interposed therebetween, and displays an image by using light provided by a backlight unit.

Further, a reflective sheet covers an LED substrate and reflects light from corresponding LEDs toward a display panel. The reflective sheet can be partitioned into several parts corresponding to the size of the display panel, but a mold is required separately for each reflective sheet.

SUMMARY OF THE INVENTION

Accordingly, one objective of the present disclosure is to solve the above and other problems.

Another object of the present disclosure is to provide a structure with common use of reflective sheets.

Another object of the present disclosure is to provide a structure using a common mold for manufacturing reflective sheets even when the number of light sources on a substrate is an odd number. In addition, another object of the present disclosure is to provide a structure in which reflective sheets overlap each other, thereby preventing any one thereof from being lifted from another. Still another object of the present disclosure is to provide various examples of a protruding portion which is cut out for common use of reflective sheets.

In accordance with an aspect of the present disclosure, the above and other objectives can be accomplished by providing a display device including: a display panel; a frame disposed at a rear of the display panel; a substrate disposed between the display panel and the frame and coupled to the frame; light sources positioned on the substrate; and a reflective sheet covering the substrate and having holes equal in number to the light sources, wherein the reflective sheet includes: a first reflective sheet having first holes which are some of the holes, the first reflective sheet including a protruding portion protruding from one side of the first reflective sheet and having some of the first holes; and a second reflective sheet having second holes which are some of the holes, wherein the second reflective sheet is identical to the first reflective sheet from which the protruding portion is cut out.

BRIEF DESCRIPTION OF THE DRAWINGS

The above and other objects, features and advantages of the present disclosure will be more apparent from the following detailed description in conjunction with the accompanying drawings, in which.

DETAILED DESCRIPTION

Figure 1:
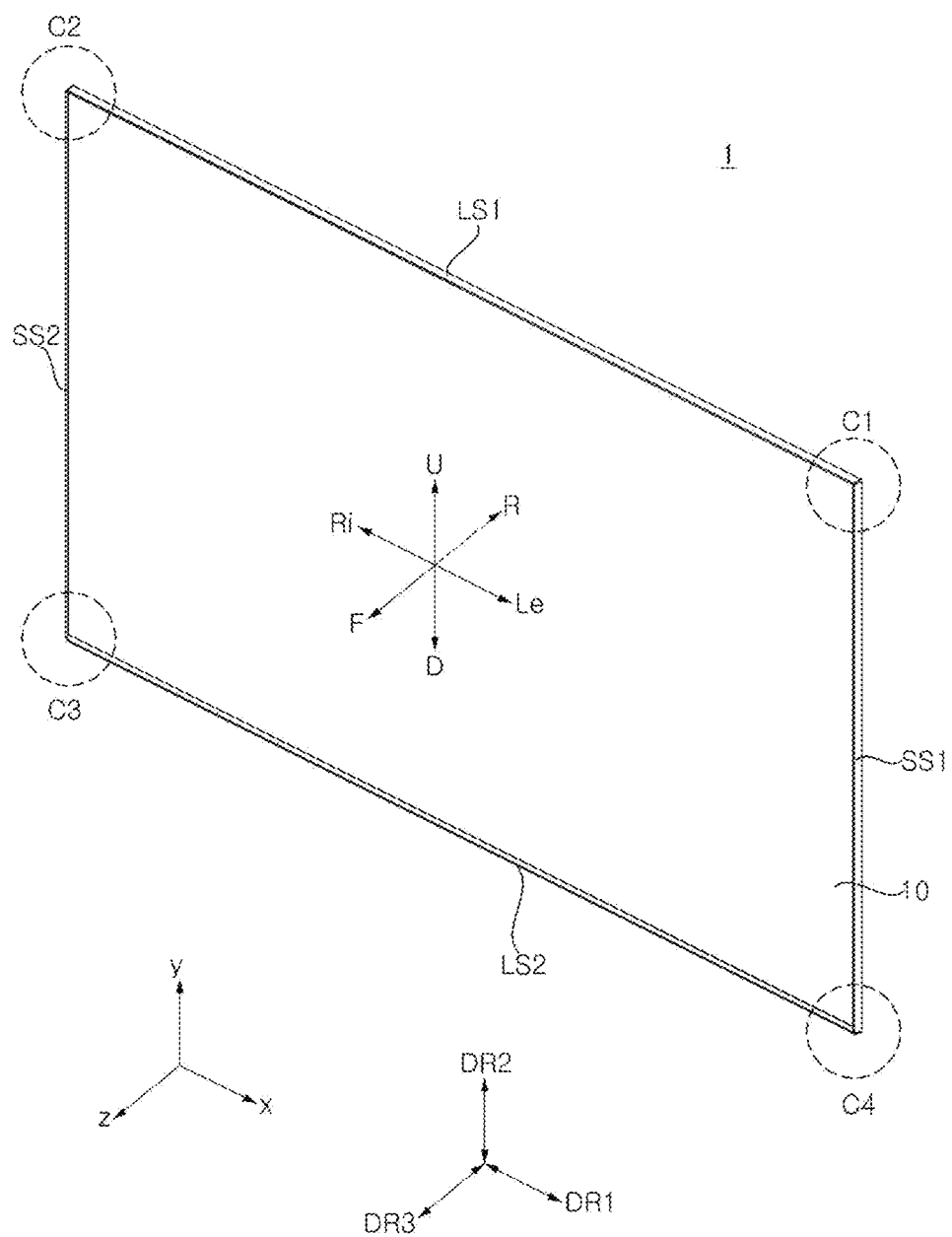
FIGS. 1 to 29 are diagrams illustrating examples of a display device according to embodiments of the present disclosure.

Hereinafter, the present disclosure will be described in detail with reference to the accompanying drawings, in which the same reference numerals are used throughout the drawings to designate the same or similar components, and a redundant description thereof will be omitted.

The suffixes, such as "module" and "unit," for elements used in the following description are given simply in view of the case of the description, and do not have a distinguishing meaning or role. Further, the accompanying drawings are used to help understand various technical features and the embodiments presented herein are not limited by the accompanying drawings. As such, the present disclosure should be construed to extend to any alterations, equivalents and substitutes in addition to those which are particularly set out in the accompanying drawings.

Although the terms first, second, etc. may be used herein to describe various elements, these elements should not be limited by these terms. These terms are only used to distinguish one element from another. Also, when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

A singular representation can include a plural representation unless context clearly indicates otherwise. In addition, the terms "comprise," "include," "have," etc. when used in this specification, specify the presence of stated features, integers, steps, operations, elements, components, or combinations thereof but do not preclude the presence or addition of one or more other features, integers, steps, operations, elements, components, or combinations thereof. References to directions, such as up (U), down (D), left (Le), right (Ri), front (F), and rear (R), shown in the drawings are provided merely for convenience of explanation and are not intended for limiting the scope of the present disclosure.

Referring to FIG. 1, a display device 1 includes a display panel 10 displaying an image. As shown, the display device 1 includes a first long side LS1, a second long side LS2 opposite to the first long side LS1, a first short side SS1 adjacent to the first long side LS1 and the second long side LS2, and a second short side SS2 opposite to the first short side SS1. For convenience of explanation, it is illustrated and described that the first and second long sides LS1 and LS2 are longer than the first and second short sides SS1 and SS2, but it is also possible that lengths of the first and second long sides LS1 and LS2 can be approximately equal to lengths of the first and second short sides SS1 and SS2.

A direction parallel to the long sides LS1 and LS2 of the display device 1 can be referred to as a left-right direction or a first direction DR1. The first short side SS1 can be referred to as a left side Le, x, and the second short side SS2 can be referred to as a right side Ri. A direction parallel to the short sides SS1 and SS2 of the display device 1 can be referred to as an up-down direction or a second direction DR2. The first long side LS1 can be referred to as an upper side U, y, and the second long side LS2 can be referred to as a lower side D.

In addition, a direction perpendicular to the long sides LS1 and LS2 and the short sides SS1 and SS2 of the display device 1 can be referred to as a front-rear direction or a third direction DR3. A side on which the display panel 10 displays an image can be referred to as a front side F, z, and a side opposite thereto can be referred to as a rear side R.

Also, the first long side LS1, the second long side LS2, the first short side SS1, and the second short side SS2 can be referred to as edges of the display device 1. Further, positions where the first long side LS1, the second long side LS2, the first short side SS1, and the second short side SS2 meet each other can be referred to as corners. A position where the first short side SS1 and the first long side LS1 meet each other can be referred to as a first corner C1. A position where the first long side LS1 and the second short side SS2 meet each other can be referred to as a second corner C2. A position where the second short side SS2 and the second long side LS2 meet each other can be referred to as a third corner C3. A position where the second long side LS2 and the first short side SS1 meet each other can be referred to as a fourth corner C4.

Figure 2:
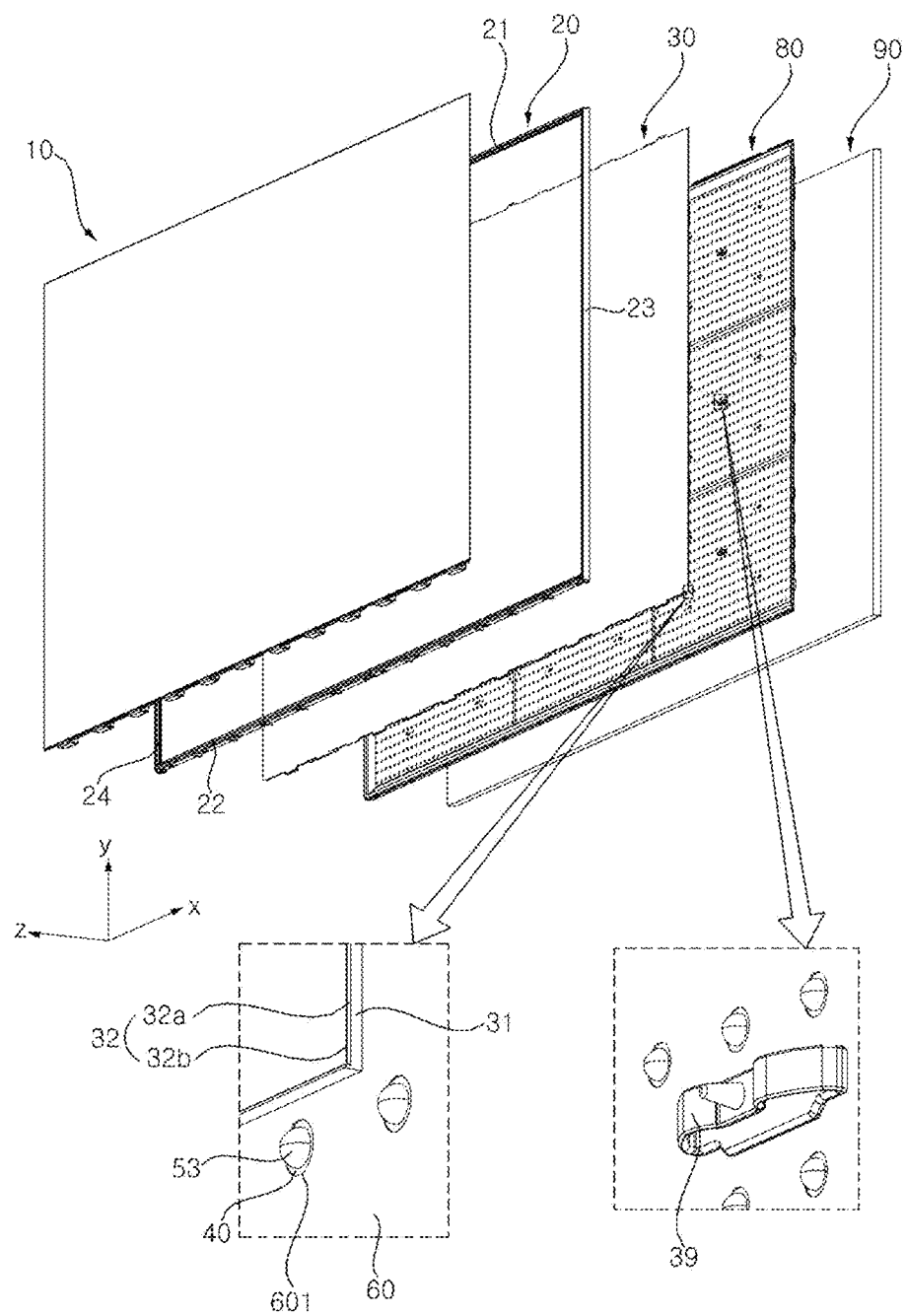

Referring to FIGS. 1 and 2, the display device 1 includes the display panel 10, a side frame 20, a backlight unit, a frame 80, and a back cover 90. Additionally, the display panel 10 can form a front surface of the display device 1 and display an image. Also, the display panel 10 can display an image by outputting red, green or blue (RGB) for each pixel by a plurality of pixels on timing. Further, the display panel 10 can be divided into an active area, in which the image is displayed, and a de-active area in which the image is not displayed. The display panel 10 can also include a front substrate and a rear substrate which are opposite each other with a liquid crystal layer sandwiched therebetween. The display panel 10 can be referred to as an LCD panel 10.

The front substrate can include a plurality of pixels made up of red (R), green (G), and blue (B) subpixels. The front substrate can also emit light corresponding to red, green, or blue color in response to a control signal.

Further, the rear substrate can include switching elements to switch on or off pixel electrodes. For example, the pixel electrode can change a molecular arrangement of a liquid crystal layer in response to a control signal received from the outside. The liquid crystal layer also includes liquid crystal molecules. Further, the arrangement of the liquid crystal molecules can be changed depending on a voltage difference between the pixel electrode and a common electrode. The liquid crystal layer can transmit light, provided from the backlight unit, to the front substrate or can block the light.

As shown, the side frame 20 extends along the edges of the display panel 10 and covers the edges of the display panel 10. For example, the side frame 20 can include a plastic or metal material. The side frame 20 can also be referred to as a guide panel 20.

In addition, the backlight unit can be disposed at the rear of the display panel 10. In more detail, the backlight unit can be disposed at the front of the frame 80 and can be coupled to the frame 80. The backlight unit can also be driven by a full driving scheme or a partial driving scheme such as local dimming, impulsive driving, or the like. Further, as shown in FIG. 2, the backlight unit can include light sources providing light to the front, a substrate 40 on which the light sources are mounted, lenses 53 covering the light sources, a reflective sheet 60 covering a front surface of the substrate 40, and an optical unit 30 located at the front of the reflective sheet 60. Meanwhile, the front surface of the substrate 40 can also be coated with a reflective material.

As shown in FIG. 2, the optical unit 30 is disposed opposite to the display panel 10 with respect to the side frame 20. The optical unit 30 can evenly transmit light from the light source to the display panel 10 and can include a diffusion plate 31 and an optical sheet 32.

In addition, the diffusion plate 31 is disposed between the reflective sheet 60 and the optical sheet 32. Additionally, the diffusion plate 31 can diffuse light from the light source. Further, an air gap can be formed between the reflective sheet 60 and the diffusion plate 31, and the light of the light source can be spread widely by the air gap. As shown in FIG. 2, a supporter 39 is disposed between the reflective sheet 60 and the diffusion plate 31, can be coupled to the reflective sheet 60 and support the diffusion plate 31.

The optical sheet 32 can also be adjacent to or in contact with a front surface of the diffusion plate 31. Additionally, the optical sheet 32 can include at least one sheet. For example, the optical sheet 32 can include a plurality of sheets having different functions, and the plurality of sheets can be bonded or adhered to each other. Further, a first optical sheet 32a can be a diffusion sheet, and a second optical sheet 32b can be a prism sheet.

In addition, the frame 80 is disposed at the rear of the backlight unit. In particular, the display panel 10, the side frame 20, and the backlight unit are coupled to the frame 80. The frame 80 can support the above components of the display device as well as components which will be described later. For example, the frame 80 can be made of a metal material such as an aluminum alloy and the like. The frame 80 can also be referred to as a main frame 80, a module cover 80, or a cover bottom 80.

Further, the back cover 90 covers the rear of the frame 80 and is coupled to the frame 80. For example, the back cover 90 may be an injection-molded product of a resin material. In another example, the back cover 90 may be made of a metal material.

Figure 3:
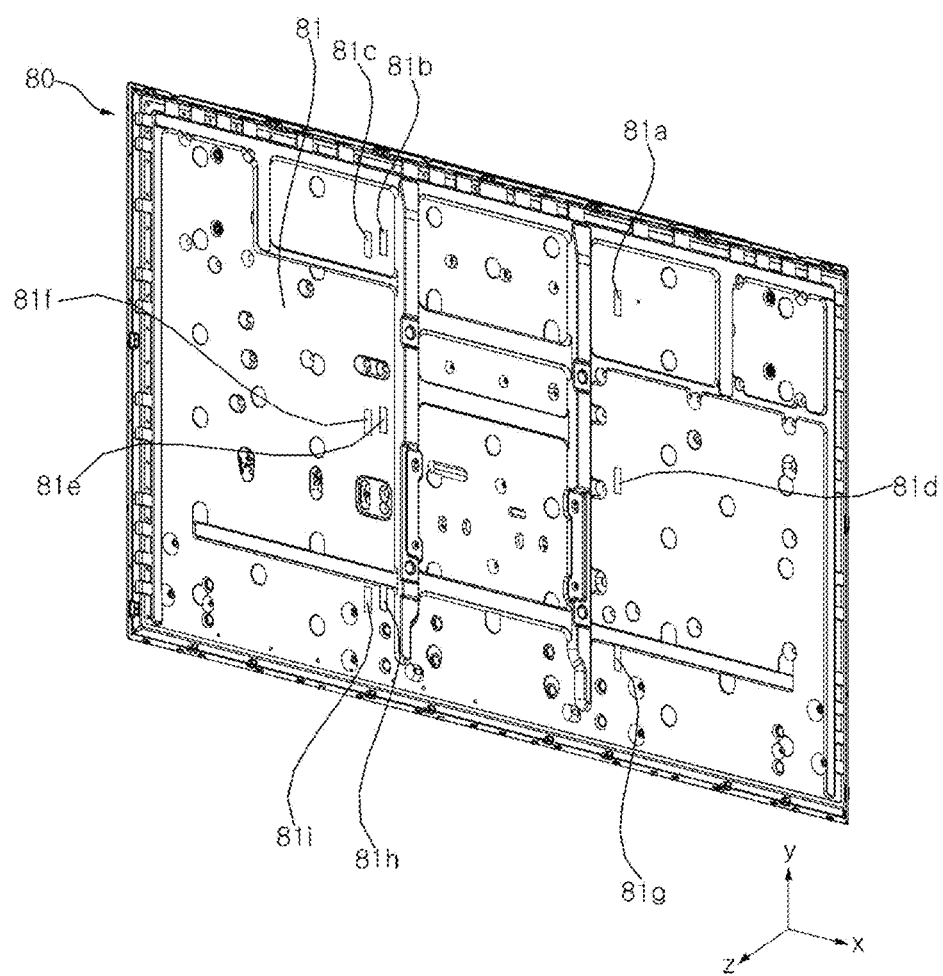

Next, FIG. 3 is an overview illustrating a flat plate part 81 defining the front surface of the frame 80. As shown, a plurality of frame holes 81a, 81b, 81c, 81d, 81e, 81f, 81g, 81h, and 81i are formed in the flat plate part 81.

Figure 4:
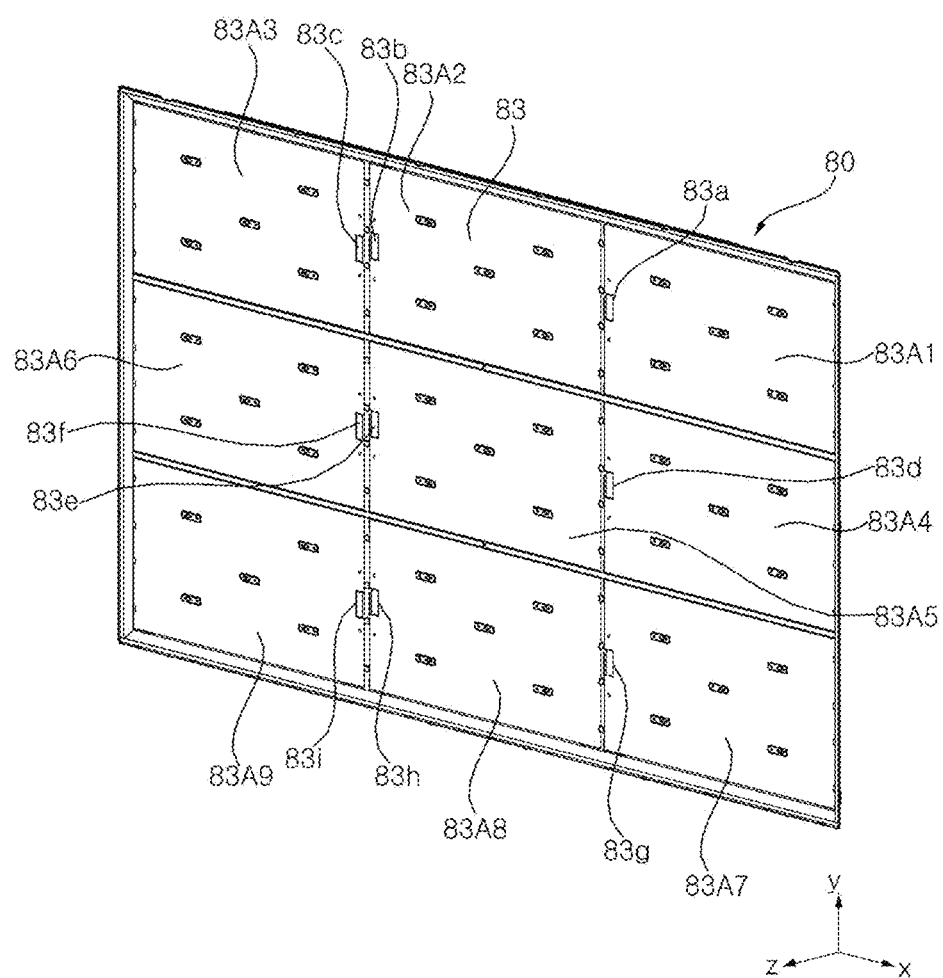

Referring to FIGS. 3 and 4, a heat sink 83 can cover a front surface of the flat plate part 81 and be coupled to the flat plate part 81. In FIG. 4, a plurality of heat sink holes 83a, 83b, 83c, 83d, 83e, 83f, 83g, 83h, and 83i are formed in the heat sink 83 and are aligned with the plurality of frame holes 81a, 81b, 81c, 81d, 81e, 81f, 81g, 81h, and 81i. The heat skin 83 can also be omitted.

Figure 5:
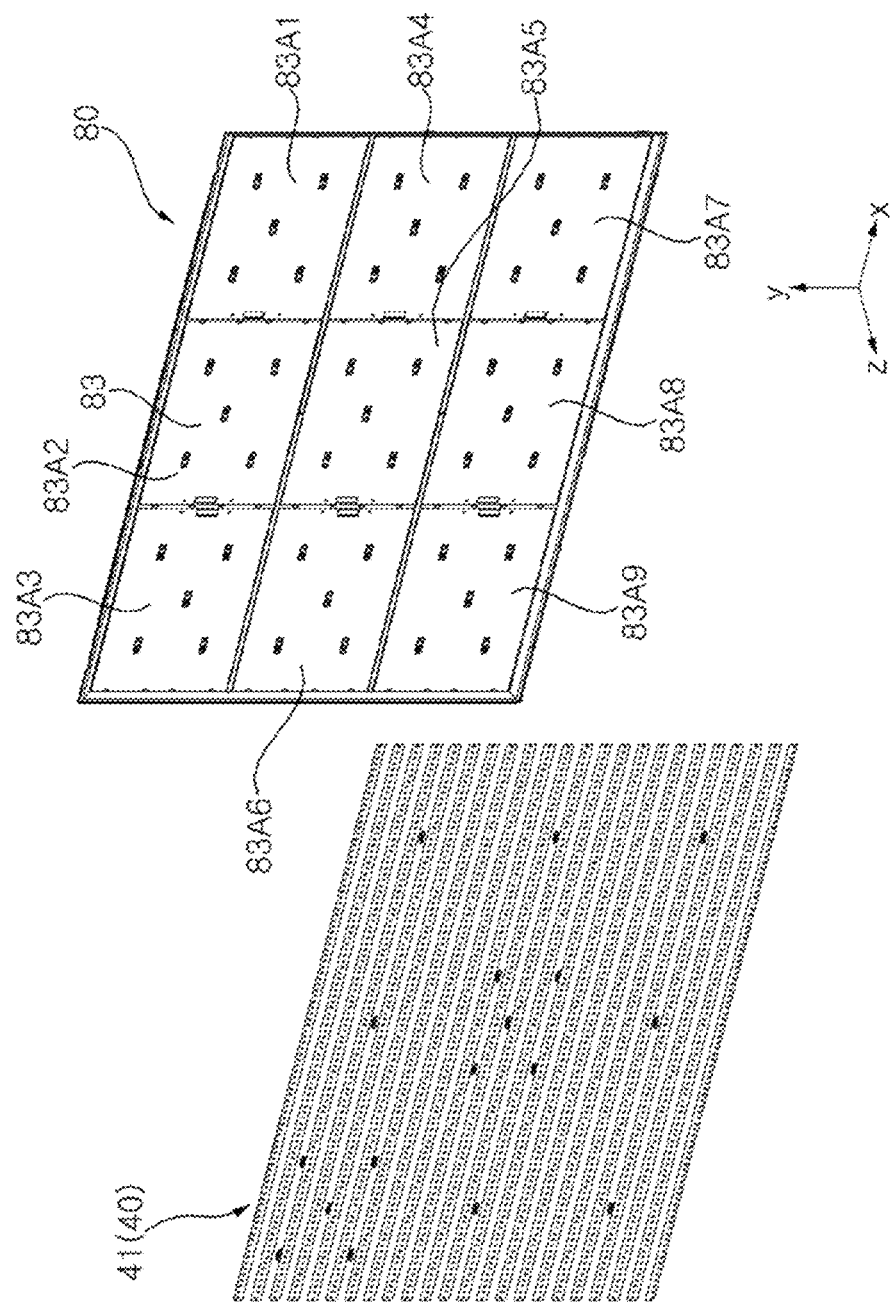
Figure 6:
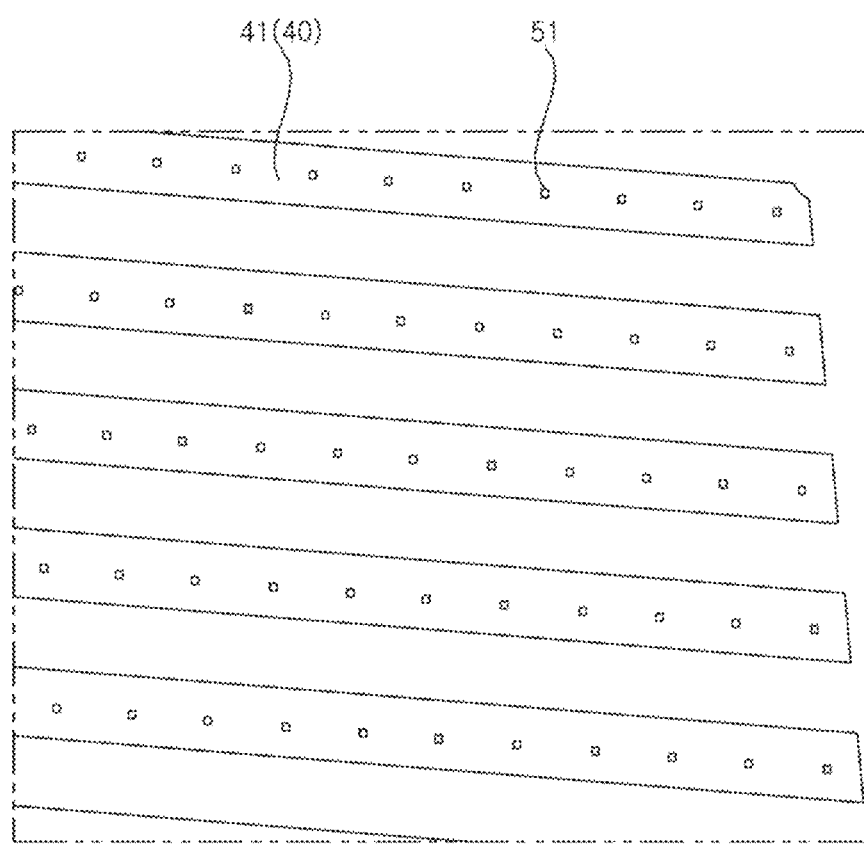

Referring to FIGS. 5 and 6, a substrate 41 can be coupled to the frame 80 or a front surface of the heat sink 83. In more detail, the substrate 41 may be a printed circuit board (PCB). For example, the substrate 41 may be made of at least one of polyethylene terephthalate (PET), glass, polycarbonate (PC), and silicon. The substrate 41 can also be composed of bars spaced apart from each other. The substrate 41 can also be referred to as the substrate 40.

As shown in FIG. 6, a light source 51 can be mounted on a front surface of the substrate 41. That is, a plurality of light sources 51 can be arranged along the respective bars of the substrate 41 as shown in FIG. 6, for example. In addition, the light source 51 can be a light emitting diode (LED) chip or an LED package. The light source 51 can also be configured as a white LED or a colored LED emitting light of at least one of red, green, and blue color, and the like. Further, the light source 51 can be a mini-LED. An electrode pattern can also be formed on the substrate 41 and connect an adapter (connector) and the light source 51. A power supply board provides power to the light source 51 through the substrate 41. For example, the electrode pattern can be a carbon nano tube (CNT) electrode pattern.

Figure 7:
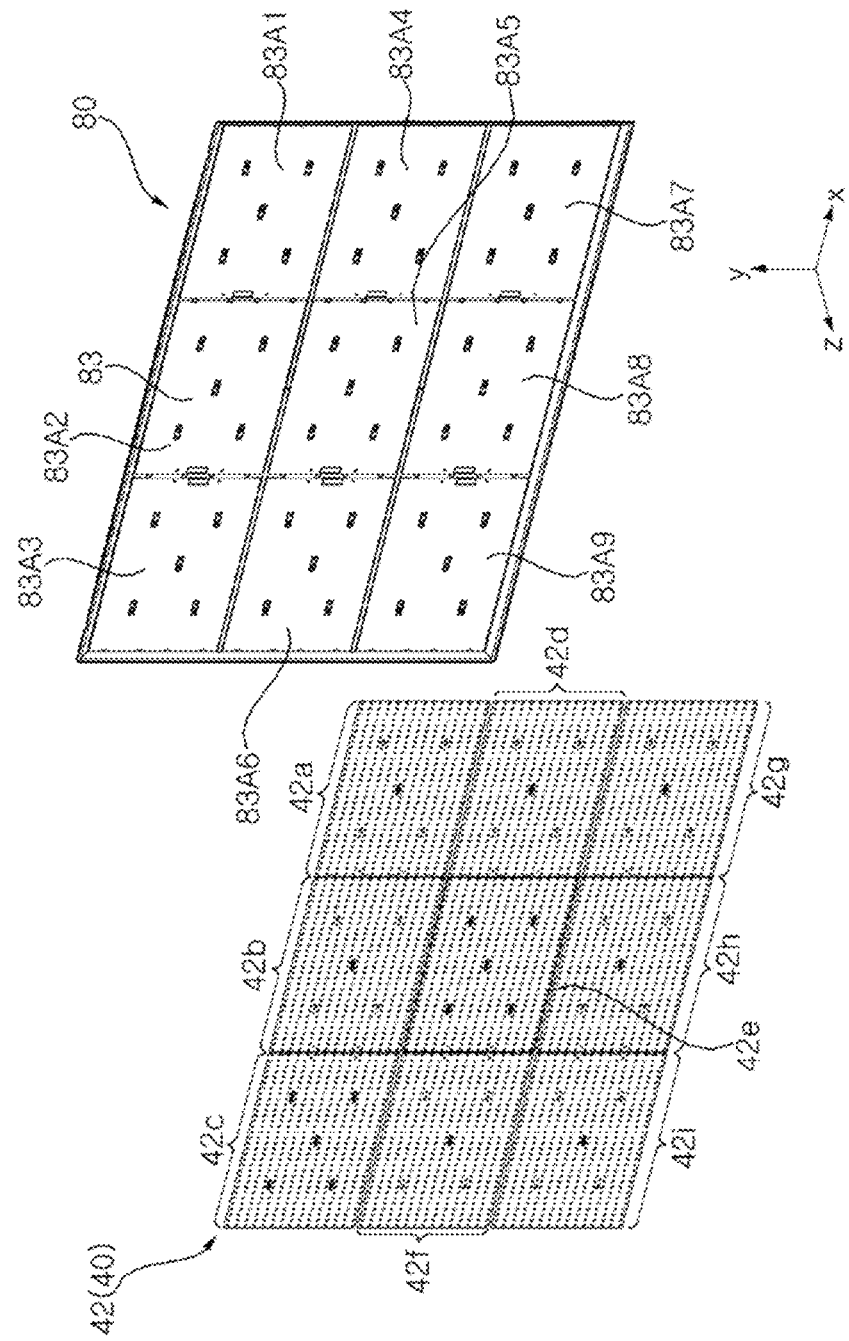
Figure 8:
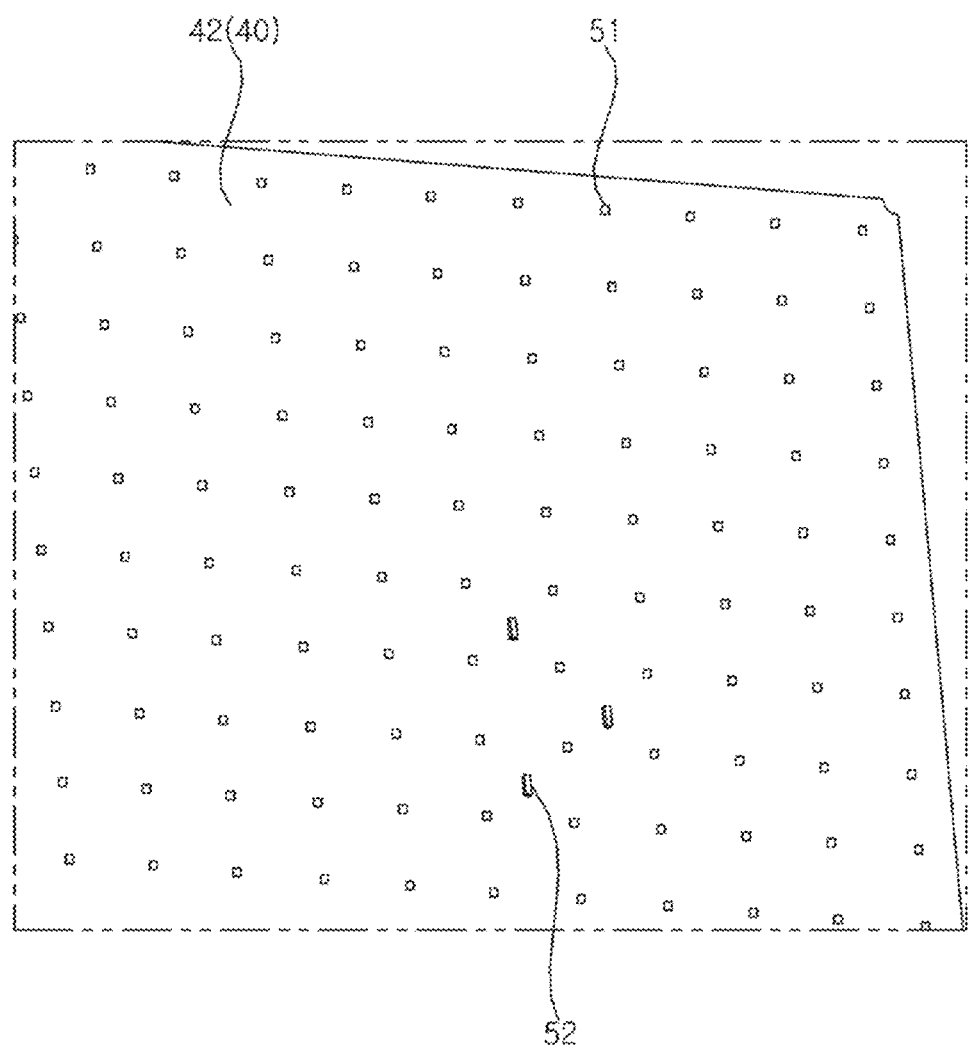

Referring to FIGS. 7 and 8, a substrate 42 can be coupled to the frame 80 or the front surface of the heat sink 83. As described above, the substrate 42 can be a printed circuit board (PCB). For example, the substrate 42 can be made of at least one of polyethylene terephthalate (PET), glass, polycarbonate (PC), and silicon. The substrate 42 can also have a plate shape and can also be referred to as the substrate 40.

As shown in FIG. 7, at least one substrate 42 may be provided. In more detail, each of a plurality of substrates 42a, 42b, 42c, 42d, 42e, 42f, 42g, 42h, and 42i cover each of a plurality of regions 83A1, 83A2, 83A3, 83A4, 83A5, 83A6, 83A7, 83A8, and 83A9 of the heat sink 83.

In addition, a light source 51 can be mounted on a front surface of the substrate 42. A plurality of light sources 51 can also be arranged in a matrix on the front surface of the substrate 42. Further, the light source 51 can be a light emitting diode (LED) chip or an LED package. In particular, the light source 51 can be configured as a white LED or a colored LED emitting light of at least one of red, green, and blue color, and the like. The light source 51 can also be a mini-LED. An electrode pattern can be formed on the substrate 42 and connect an adapter (connector) and the light source 51. A power supply board also provides power to the light source 51 through the substrate 41. For example, the electrode pattern can be a carbon nano tube (CNT) electrode pattern.

Figure 9:
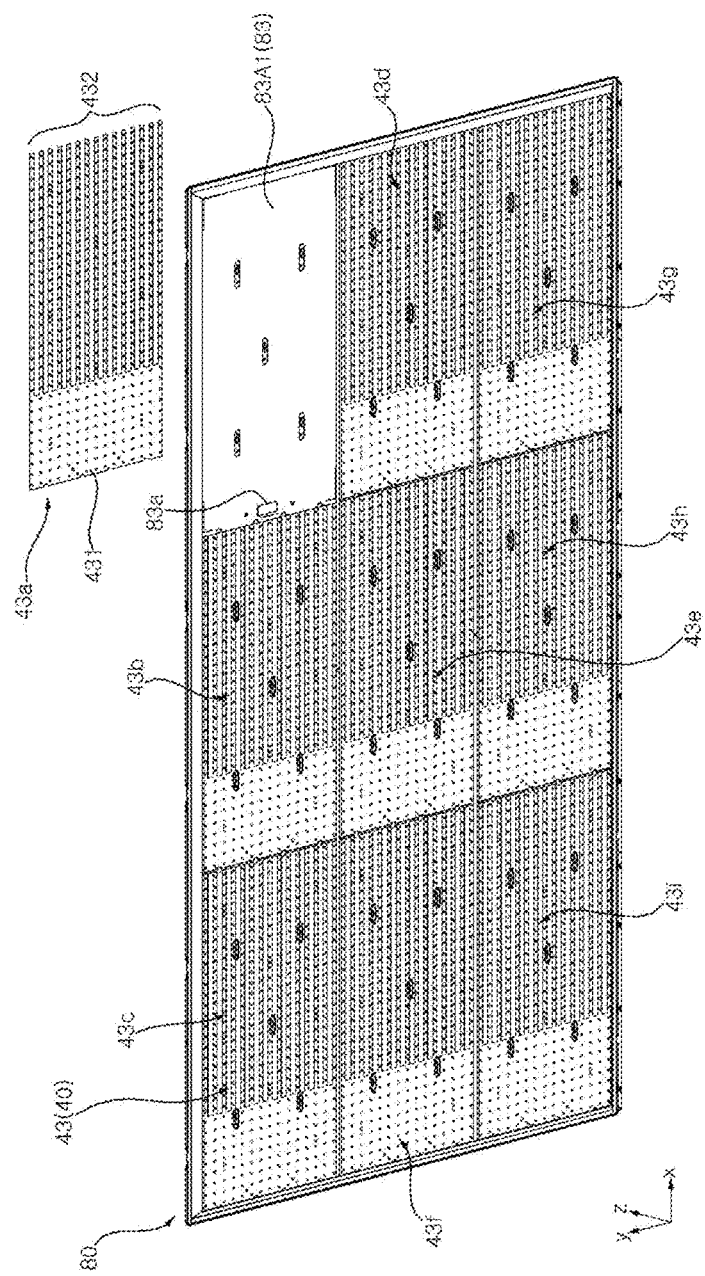
Figure 10:
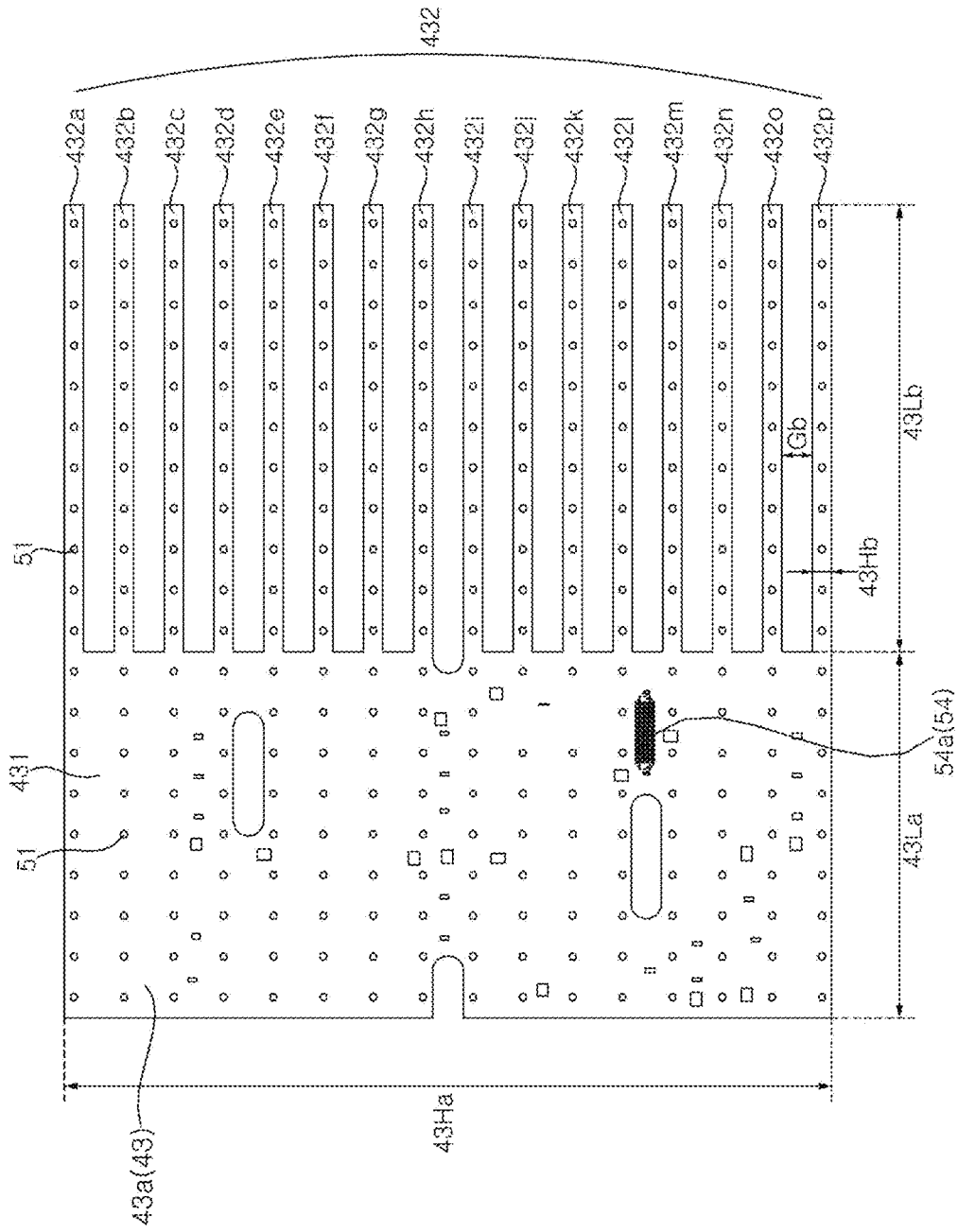

Referring to FIGS. 9 and 10, a substrate 43 can be coupled to the frame 80 or a front surface of the heat sink 83. The substrate 43 can be a printed circuit board (PCB). For example, the substrate 43 can be made of at least one of polyethylene terephthalate (PET), glass, polycarbonate (PC), and silicon. The substrate 43 can also have a fork shape as shown in FIG. 10. The substrate 43 can be referred to as the substrate 40.

In addition, as shown in FIG. 10, the substrate 43 can include a body 431 and legs 432. The body 431 can also be elongated. Further, the legs 432 can extend from one long side of the body 431 in a direction intersecting the body 431. A longitudinal direction of the body 431 can be defined in a vertical direction, and a longitudinal direction of the legs 432 can be defined in a horizontal direction. A width 43La of the body 431 can also be smaller than a length 43Ha of the body 431 and be smaller than or similar to a length 43Lb of the legs 432. The legs 432 can also be spaced apart from each other in the longitudinal direction of the body 431. Further, a gap Gb between the legs 432 may be equal to a width 42Hb of the legs 432. In addition, at least one substrate 43 can be provided and each of a plurality of substrates 43 can be bonded or attached to each of a plurality of regions 83A1, 83A2, 83A3, 83A4, 83A5, 83A6, 83A7, 83A8, and 83A9 (see FIG. 4) of the heat sink 83.

Also, the light source 51 is mounted on a front surface of the substrate 43. In more detail, the plurality of light sources 51 can be arranged in a matrix on a front surface of the legs 432 and the body 431. The light source 51 may be a light emitting diode (LED) chip or an LED package. The light source 51 can also be configured as a white LED or a colored LED emitting light of at least one of red, green, and blue color, and the like. Further, light source 51 may be a mini-LED. An electrode pattern can also be formed on the substrate 43 and connect an adapter (connector) and the light source 51. A power supply board provides power to the light source 51 through the substrate 43. For example, the electrode pattern can be a carbon nano tube (CNT) electrode pattern.

Figure 11:
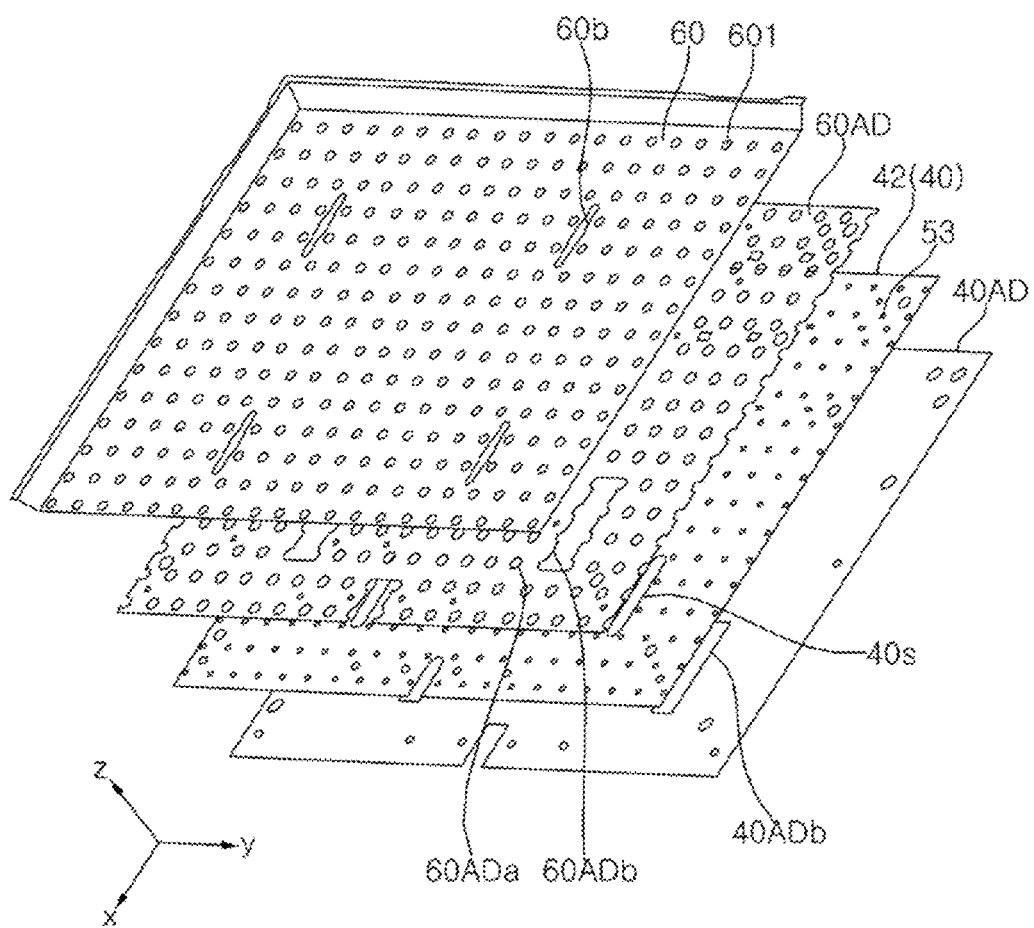
Figure 12:
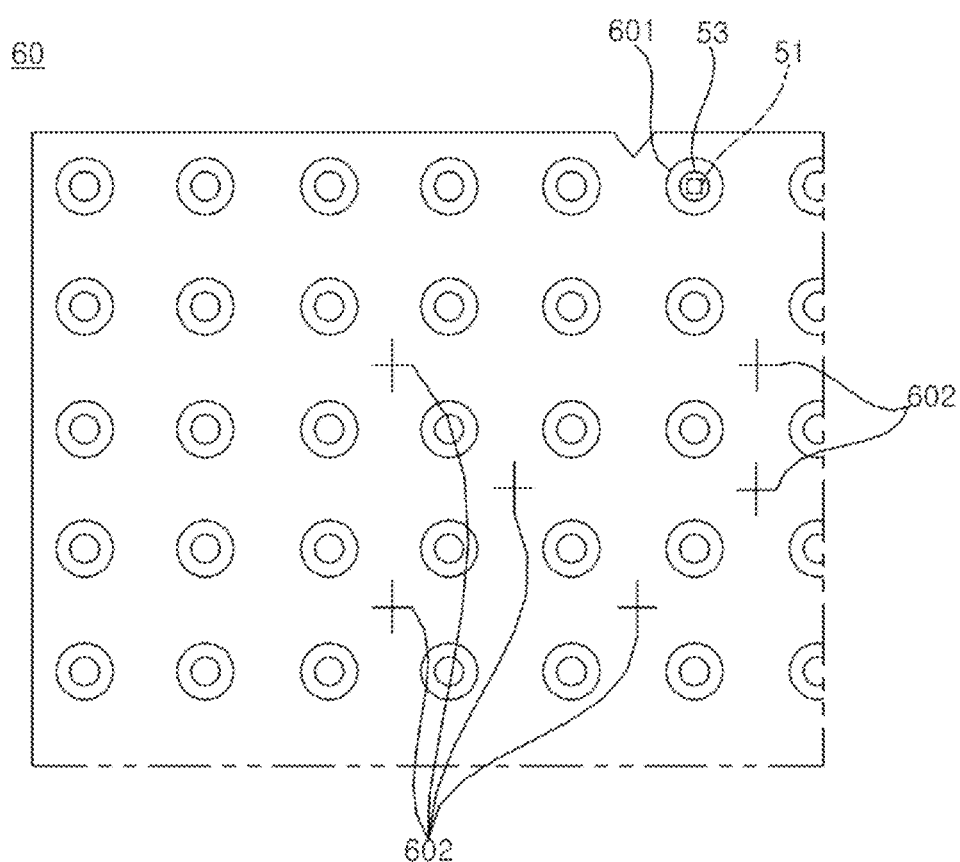
Figure 13:
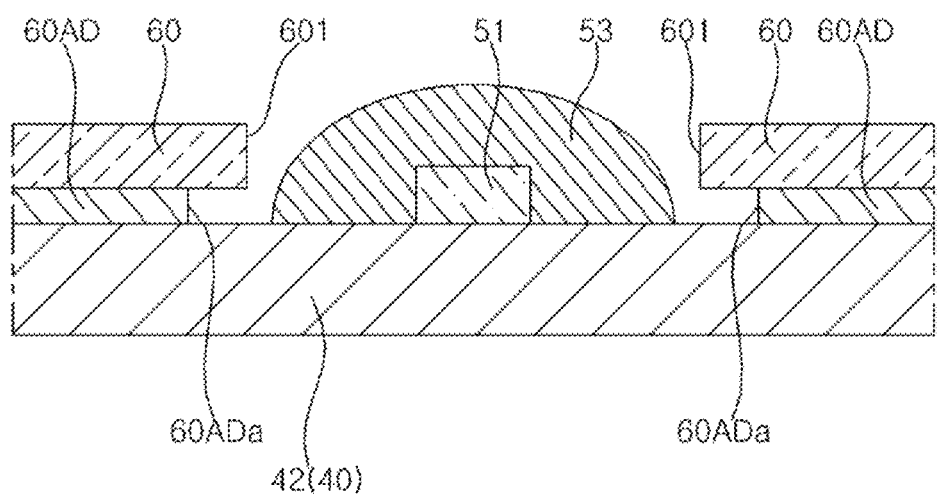

Referring to FIGS. 11 to 13, the substrate 40 can be attached to the front surface of the heat sink 83 by an adhesive member 40AD such as double-sided tape. Alternatively, an adhesive can be applied to a rear surface of the substrate 40. The reflective sheet 60 can also be attached to the front surface of the substrate 40 by an adhesive member 60AD such as double-sided tape. Alternatively, an adhesive may be applied to a rear surface of the reflective sheet 60. The reflective sheet 60 can thus cover elements, such as a connector, jumper, Zener diode, etc., which are mounted on the substrate 40. The reflective sheet 60 can also reflect light forward, which is provided from the light source 51 or reflected from the diffusion plate 31 (see FIG. 2). For example, the reflective sheet 60 may include a metal and/or metal oxide having high reflectance, such as at least one of aluminum (Al), silver (Ag), gold (Au), and titanium dioxide (TiO2). The resin can also be deposited or applied on the reflective sheet 60. Further, the at least one reflective sheet 60 can include plurality of reflective sheets 60 to cover the substrate(s) 40.

In addition, holes 601 are formed in the reflective sheet 60, and the light sources 51 or the lenses 53 covering the light sources 51 are arranged in the holes 601. The lenses 53 can pass through holes 60ADa of the adhesive member 60AD and holes 60a of the reflective sheet 60. The lens 53 can also include a silicone material and increase an orientation angle. Further, a diameter of the hole 601 may be greater than a diameter of the lens 53, and the number of holes 601 may be equal to the number of light sources 51 or lenses 53.

Meanwhile, as shown in FIG. 12, a cut-line(s) 602 can be formed on the reflective sheet 60 and be opened by a protruding element (e.g., Zener diode). The cut-line 602 can have various shapes, such as "+," "x," "l," "−," or "☐," and the like.

In addition, the supporter 39 shown in FIG. 2 can sequentially pass through the hole 60b of the reflective sheet 60, a hole 60ADb of the adhesive member 60AD, a hole 40s of the substrate 41, and a hole 40ADb of the adhesive member 40AD, to be removably coupled to the heat sink 83 and/or the frame 80. A front end of the supporter 39 can also support the rear surface of the diffusion plate 31 (see FIG. 2).

Figure 14:
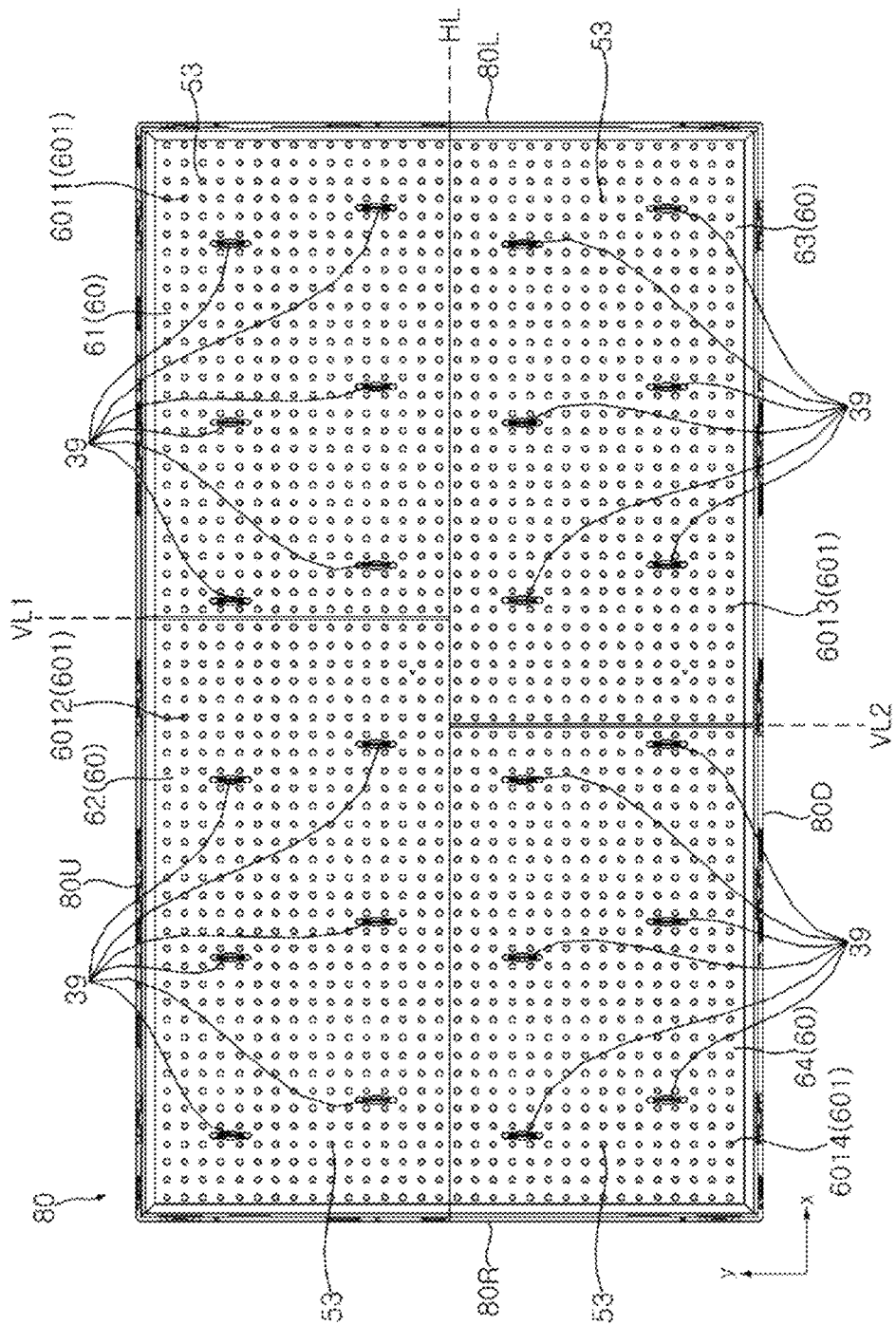

Referring to FIG. 14, a plurality of reflective sheets 60 can cover the front surface of the substrate 40. In addition, the number of holes 601 of the reflective sheets 60 may be equal to the number of light source 51 or lenses 53. For example, as shown in FIG. 14, a first reflective sheet 61, a second reflective sheet 62, a third reflective sheet 63, and a fourth reflective sheet 64 can cover the front surface of the substrate 40.

As shown, the first reflective sheet 61 can be adjacent to a left side 80L and an upper side 80U of the frame 80 and have a rectangular shape. Also, the second reflective sheet 62 can be adjacent to a right side 80R and the upper side 80U of the frame 80 and have a rectangular shape. A first vertical line VL1 extends along a boundary between the first reflective sheet 61 and the second reflective sheet 62.

In addition, the third reflective sheet 63 can be adjacent to the left side 80L and a lower side 80D of the frame 80, and have a rectangular shape. Also, the fourth reflective sheet 64 can be adjacent to the right side 80R and the lower side 80D of the frame 80, and have a rectangular shape. A second vertical line VL2 also extends along a boundary between the third reflective sheet 63 and the fourth reflective sheet 64.

Further, a horizontal line HL extends along a boundary between the first and second reflective sheets 61 and 62 and the third and fourth reflective sheets 63 and 64. The first vertical line VL1 and the second vertical line VL2 are also spaced apart from each other in the left-right direction.

If two of the first to fourth reflective sheets 61, 62, 63, and 64 are the same and a sum of the number of holes 601 of the first to fourth reflective sheets 61, 62, 63, and 64 is an even number, the remaining two reflective sheets may also be the same. Specifically, the first reflective sheet 61 and the fourth reflective sheet 64 may be the same. In other words, the first reflective sheet 61 and the fourth reflective sheet 64 can be manufactured using the same mold. The number of holes 6011 of the first reflective sheet 61 and the number of holes 6014 of the fourth reflective sheet 64 can be an even number or an odd number. That is, the sum of the number of holes 6011 of the first reflective sheet 61 and the number of holes 6014 of the fourth reflective sheet 64 can be an even number.

In this instance, if the sum of the number of holes 601 of the first to fourth reflective sheets 61, 62, 63, and 64 is an even number, the sum of the number of holes 6012 of the second reflective sheet 62 and the number of holes 6013 of the third reflective sheet 63 can also be an even number. That is, the number of holes 6012 of the second reflective sheet 62 and the number of holes 6013 of the third reflective sheet 63 can be an even number or an odd number, and the second reflective sheet 62 and the third reflective sheet 63 can be the same. In other words, the second reflective sheet 62 and the third reflective sheet 63 can be manufactured using the same mold. In this instance, the first to fourth reflective sheets 61, 62, 63, and 64 can be reflective sheets partitioned into two types and four parts.

Figure 15:
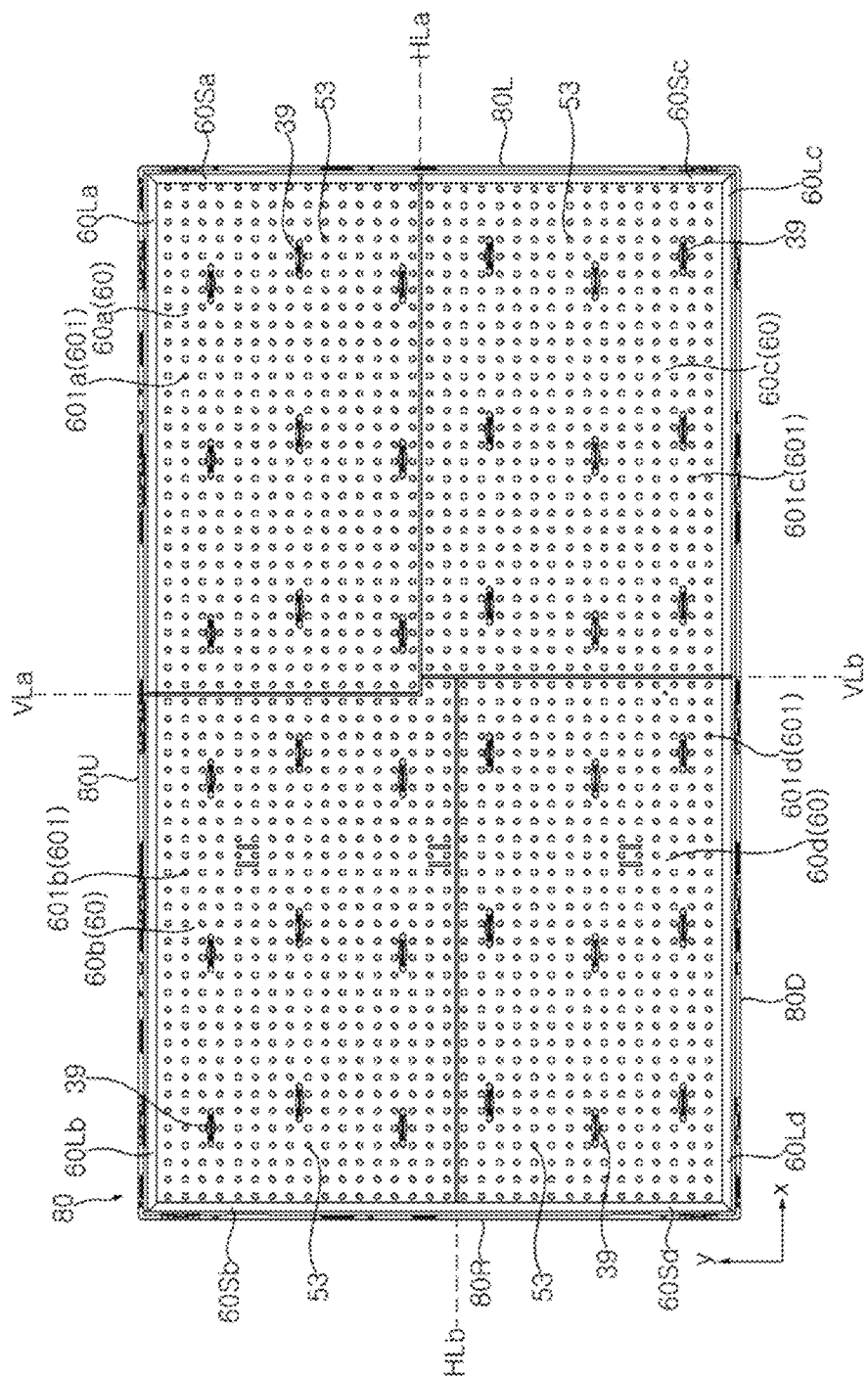

Referring to FIG. 15, the plurality of reflective sheets 60 can cover the front surface of the substrate 40. Also, the number of holes 601 of the reflective sheets 60 can be equal to the number of light sources 51 or lenses 53. For example, a first reflective sheet 60a, a second reflective sheet 60b, a third reflective sheet 60c, and a fourth reflective sheet 60d can cover the front surface of the substrate 40.

As shown, the first reflective sheet 60a can be adjacent to the left side 80L and the upper side 80U of the frame 80 and have a rectangular shape. Also, the second reflective sheet 60b can be adjacent to the right side 80R and the upper side 80U of the frame 80 and have a rectangular shape. A first vertical line VLa also extends along a boundary between the first reflective sheet 60a and the second reflective sheet 60b.

Further, the third reflective sheet 60c can be adjacent to the left side 80L and the lower side 80D of the frame 80 and have a rectangular shape. The fourth reflective sheet 60d can be adjacent to the right side 80R and the lower side 80D of the frame 80 and have a rectangular shape. A second vertical line VLb also extends along a boundary between the third reflective sheet 60c and the fourth reflective sheet 60d.

A first horizontal line HLa extends along a boundary between the first reflective sheet 60a and the third reflective sheet 60c. In addition, a second horizontal line HLb extends along a boundary between the second reflective sheet 60b and the fourth reflective sheet 60d. The first vertical line VLa and the second vertical line VLb are also spaced apart from each other in the left-right direction, and the first horizontal line HLa and the second horizontal line HLb are spaced apart from each other in the up-down direction. Accordingly, the boundary between the first to fourth reflective sheets 60a, 60b, 60c, and 60d is not clearly visible on the screen compared to when the boundary between the reflective sheets is formed by one long horizontal line and one long vertical line.

In addition, if at least two of the first to fourth reflective sheets 60a, 60b, 60c, 60d are the same and a sum of the number of holes 601 of the first to fourth reflective sheets 60a, 60b, 60c, 60d is an odd number, the remaining two reflective sheets can be different from each other. Specifically, the first reflective sheet 60a and the fourth reflective sheet 60d can be the same. In other words, the first reflective sheet 60a and the fourth reflective sheet 60d can be manufactured using the same mold. The number of holes 601a of the first reflective sheet 60a and the number of holes 601d of the fourth reflective sheet 60d can be an even number or an odd number. That is, the sum of the number of holes 601a of the first reflective sheet 60a and the number of holes 601d of the fourth reflective sheet 60d can be an even number.

In this instance, if the sum of the number of holes 601 of the first to fourth reflective sheets 60a, 60b, 60c, and 60d is an odd number, the sum of the number of holes 601b of the second reflective sheet 60b and the number of holes 601c of the third reflective sheet 60c can be an odd number. That is, any one of the number of holes 601b of the second reflective sheet 60b and the number of holes 601c of the third reflective sheet 60c can be an even number and the other one can be an odd number. In other words, the second reflective sheet 60b and the third reflective sheet 60c can be different from each other.

For example, the number of holes 601a of the first reflective sheet 60a and the number of holes 601d of the fourth reflective sheet 60d can be equal to each other in which the number is 798. The number of holes 601b of the second reflective sheet 60b can be 891, and the number of holes 601c of the third reflective sheet 60c can be 888.

As will be described below, the first to fourth reflective sheets 60a, 60b, 60c, and 60d may not overlap each other in the front-rear direction and can be coupled or attached on the substrate 40. That is, it is possible to prevent some (particularly, neighboring portions) of the first to fourth reflective sheets 60a, 60b, 60c, and 60d from being lifted or peeled from the substrate 40.

Meanwhile, the size and number of the reflective sheets illustrated in FIG. 15 is merely exemplary. That is, the reflective sheet 60 can be divided into various numbers of parts, such as two parts, three parts, four parts (see FIG. 15), six parts, eight parts, and the like.

Figure 16:
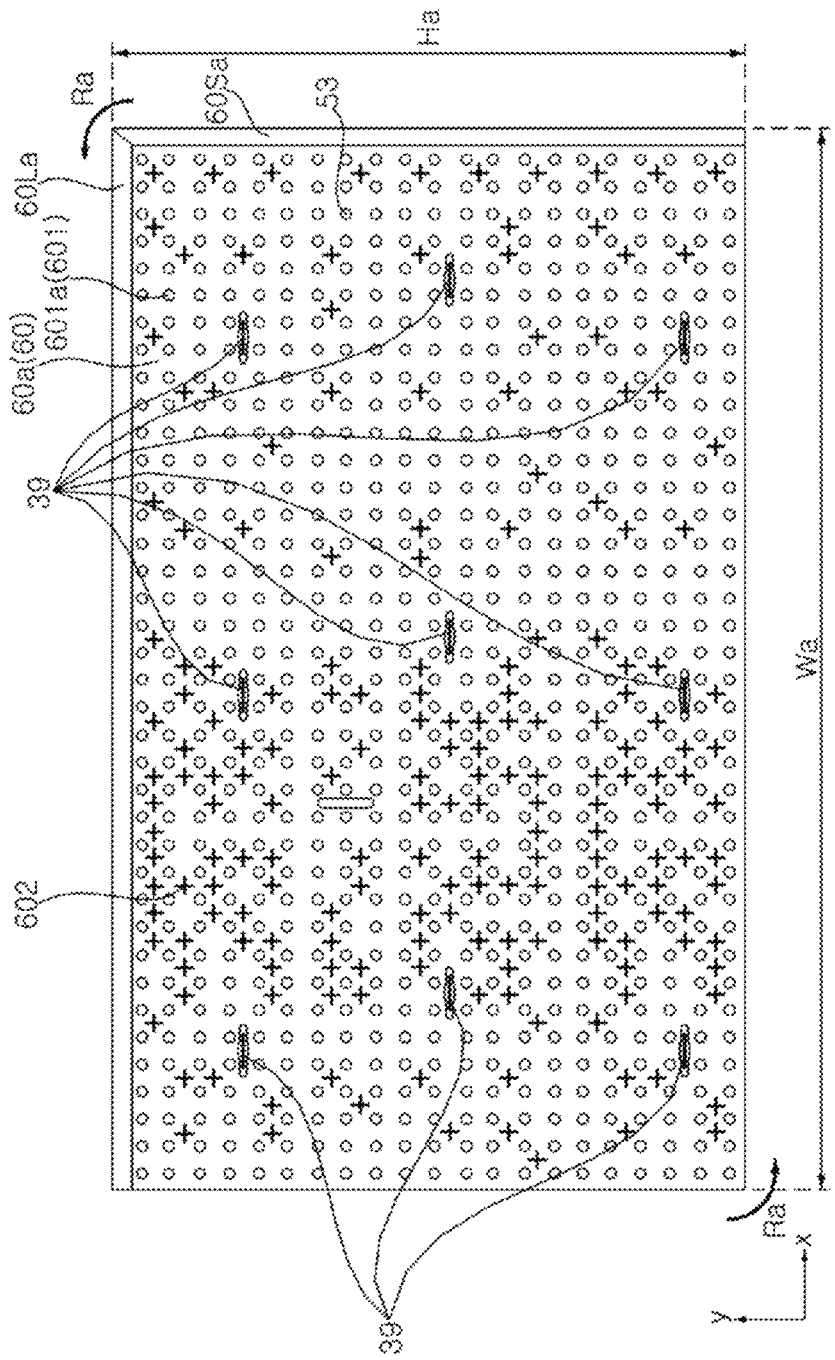
Figure 17:
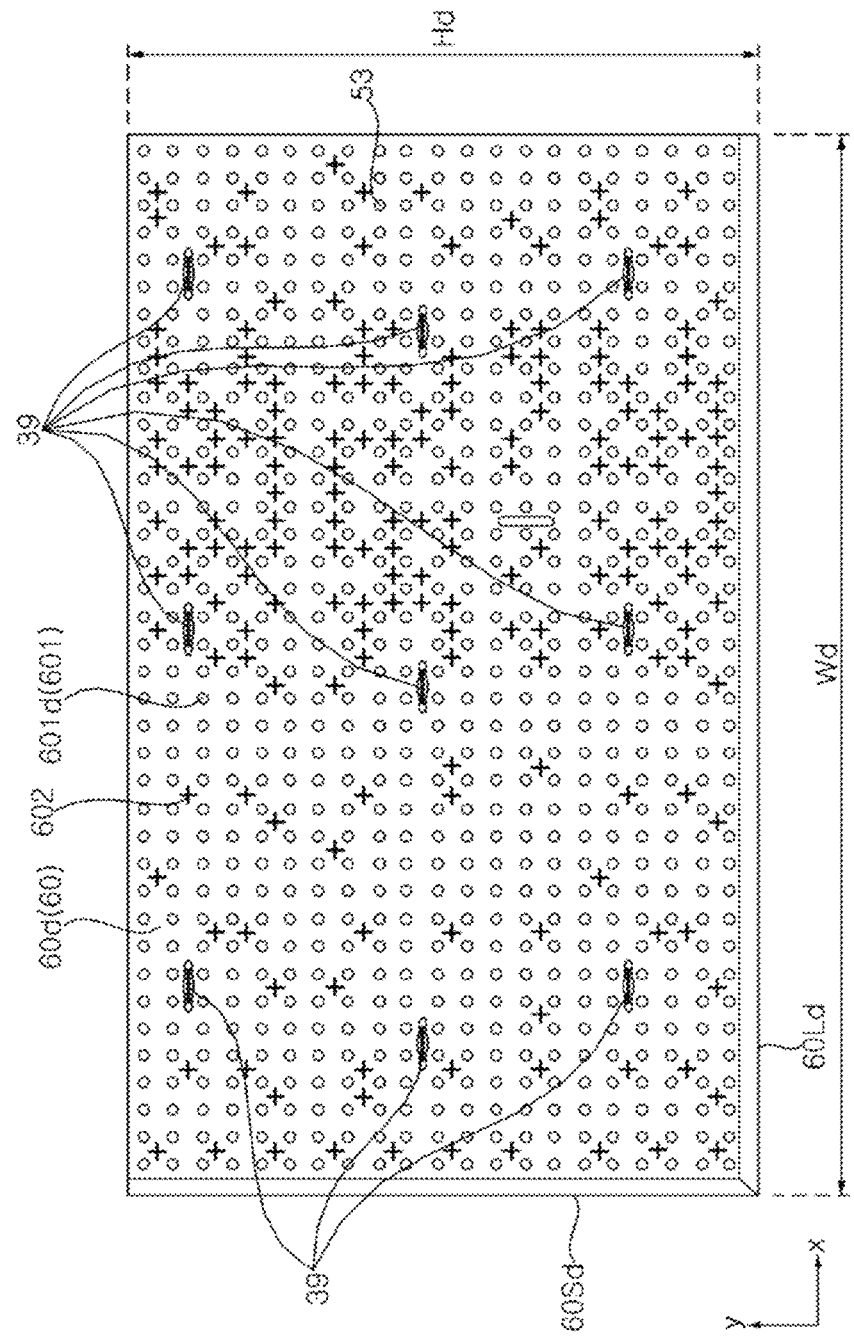

Referring to FIGS. 16 and 17, a horizontal length Wa of the first reflective sheet 60a can be greater than a vertical length Ha thereof. A first vertical side part 60Sa can be bent obliquely forward from a left side of the first reflective sheet 60a and can extend along the left side. A first horizontal side part 60La can be bent obliquely forward from an upper side of the first reflective sheet 60a and can extend along the upper side. The first horizontal side part 60La and the first vertical side part 60Sa can meet each other. The surfaces of the first vertical side part 60Sa and the first horizontal side part 60La can be made of a reflective material. The first vertical side part 60Sa can be referred to as a first vertical chamfered portion 60Sa, and the first horizontal side part 60La can be referred to as a first horizontal chamfered portion 60La.

A horizontal length Wd of the fourth reflective sheet 60d can be equal to the horizontal length Wa of the first reflective sheet 60a, and a vertical length Hd of the fourth reflective sheet 60d can be equal to the vertical length Ha of the first reflective sheet 60a. A fourth vertical side part 60Sd can be bent obliquely forward from a right side of the fourth reflective sheet 60d and can extend along the right side. In addition, a fourth horizontal side part 60Ld can be bent obliquely forward from a lower side of the fourth reflective sheet 60d and can extend along the lower side. The fourth horizontal side part 60Ld and the fourth vertical side part 60Sd can meet each other. Also, the surfaces of the fourth vertical side part 60Sd and the fourth horizontal side part 60Ld can be made of a reflective material. The fourth vertical side part 60Sd can be referred to as a fourth vertical chamfered portion 60Sd, and the fourth horizontal side part 60Ld can be referred to as a fourth horizontal chamfered portion 60Ld.

In this instance, after being rotated by 180 degrees (see Ra of FIG. 16), the first reflective sheet 60a can be identical to the fourth reflective sheet 60d. After being rotated by 180 degrees (see Ra of FIG. 16), the first vertical side part 60Sa of the first reflective sheet 60a can be identical to the fourth vertical side part 60Sd of the fourth reflective sheet 60d. After being rotated by 180 degrees (see Ra of FIG. 16), the first horizontal side part 60La of the first reflective sheet 60a can be identical to the fourth horizontal side part 60Ld of the fourth reflective sheet 60d. Alternatively, the above side parts 60Sa, 60La, 60Sd, and 60Ld can be omitted, and the fourth reflective sheet 60d can be the same as the first reflective sheet 60a. Accordingly, the first reflective sheet 60a and the fourth reflective sheet 60d can be manufactured using a single mold.

Figure 18:
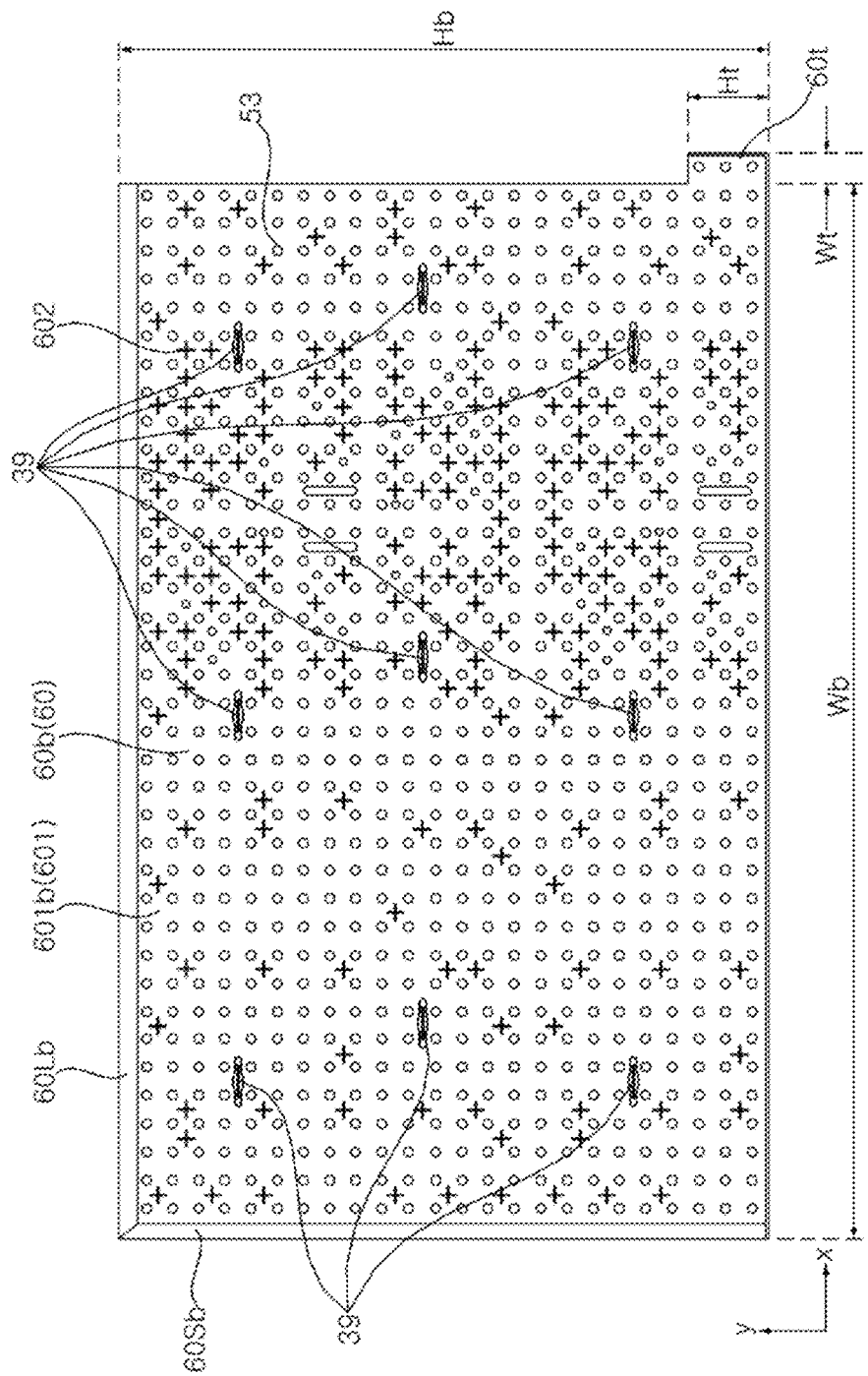

Referring to FIG. 18, a horizontal length Wb of the second reflective sheet 60b can be greater than a vertical length Hb thereof. Also, a second vertical side part 60Sb can be bent obliquely forward from a right side of the second reflective sheet 60b and can extend along the right side. In addition, a second horizontal side part 60Lb can be bent obliquely forward from an upper side of the second reflective sheet 60b and can extend along the upper side. The second vertical side part 60Sb and the second horizontal side part 60Lb can meet each other. Further, the surfaces of the second vertical side part 60Sb and the second horizontal side part 60Lb can be made of a reflective material. The second vertical side part 60Sb can also be referred to as a second vertical chamfered portion 60Sb, and the second horizontal side part 60Lb can be referred to as a second horizontal chamfered portion 60Lb.

In addition, a protruding portion 60t can protrude from one side of the second reflective sheet 60b. The one side can be a side of the second reflective sheet 60b on which the side parts 60Sb and 60Lb are not formed. For example, the protruding portion 60t can protrude leftward from the left side of the second reflective sheet 60b and can be adjacent to a lower side of the second reflective sheet 60b. As shown, the protruding portion 60t can have a predetermined width Wt and height Ht. Like other portions of the second reflective sheet 60b, the protruding portion 60t as a reflective sheet can include a reflective material and can have holes 601b in which the lenses 53 are disposed.

Figure 19:
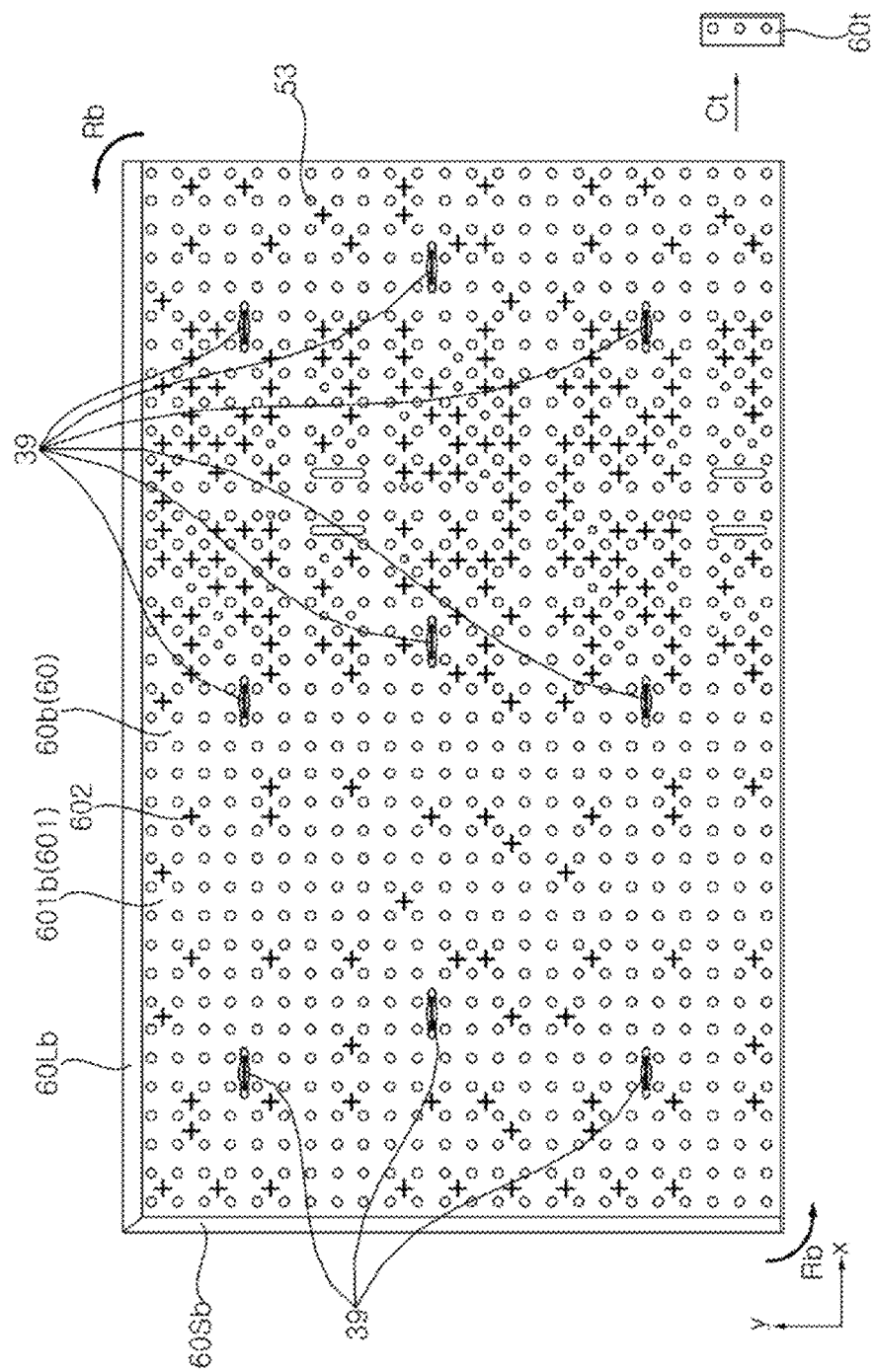
Figure 20:
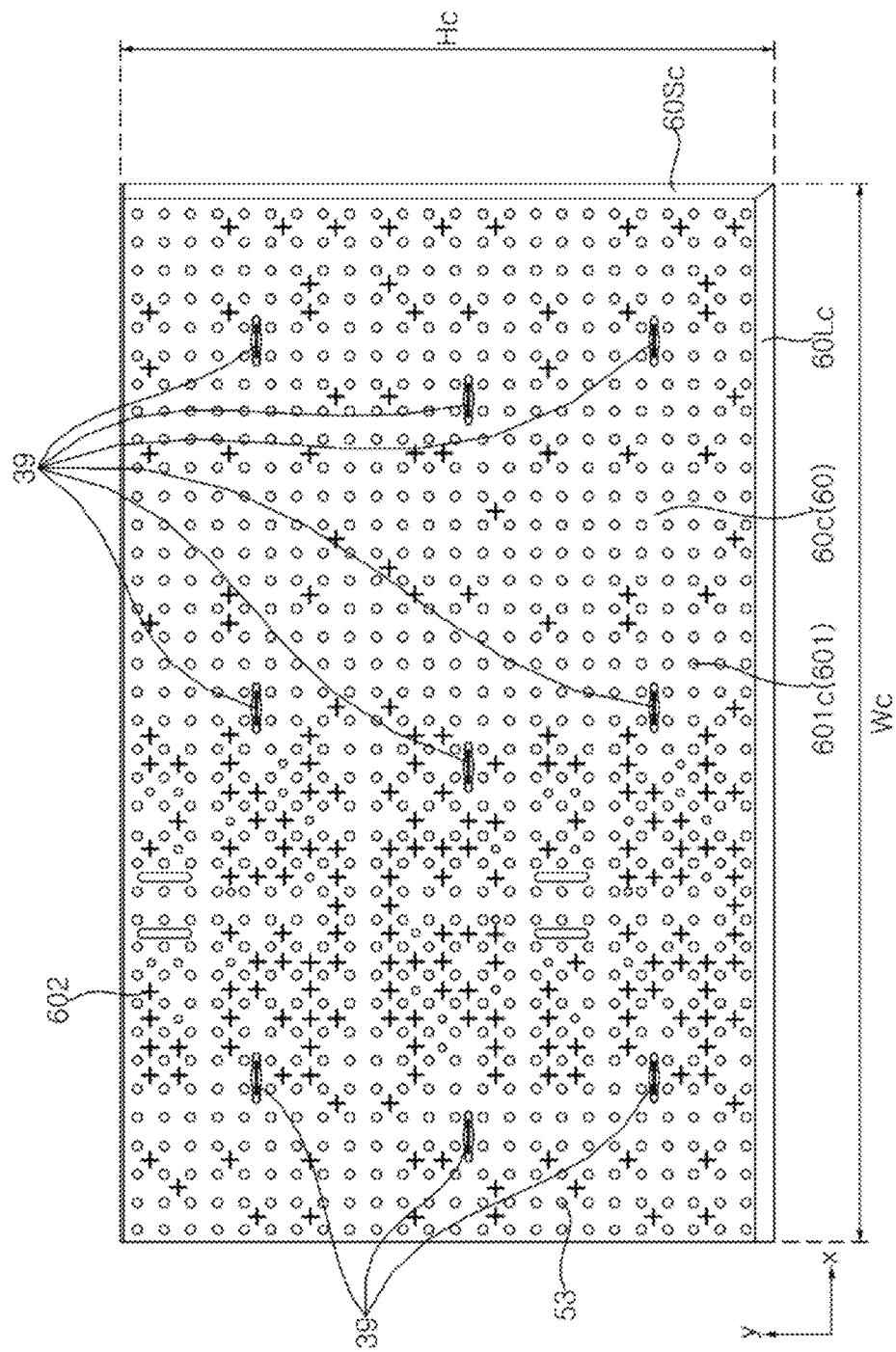

Next, referring to FIGS. 19 and 20, a horizontal length Wc of the third reflective sheet 60c can be equal to the horizontal length Wb of the second reflective sheet 60b, and a vertical length Hc of the third reflective sheet 60c can be equal to the vertical length Hb of the second reflective sheet 60b. Also, a third vertical side part 60Sc can be bent obliquely forward from a left side of the third reflective sheet 60c and can extend along the left side. In addition, a third horizontal side part 60Lc can be bent obliquely forward from a lower side of the third reflective sheet 60c and can extend along the lower side. The third vertical side part 60Sc and the third horizontal side part 60Lc can meet each other. The surfaces of the third vertical side part 60Sc and the third horizontal side part 60Lc can be made of a reflective material. The third vertical side part 60Sc can be referred to as a third vertical chamfered portion 60Sc, and the third horizontal side part 60Lc can be referred to as a third horizontal chamfered portion 60Lc.

Further, the number of holes 601b of the second reflective sheet 60b having the protruding portion 60t can be an odd number, the number of holes 601c of the third reflective sheet 60c can be an even number, and the number of holes 601b of the protruding portion 60t can be an odd number (e.g., 3). Alternatively, the number of holes 601b of the second reflective sheet 60b having the protruding portion 60t can be an even number, the number of holes 601c of the third reflective sheet 60c can be an odd number, and the number of holes 601b of the protruding portion 60t can be an odd number (e.g., 3).

In this instance, the third reflective sheet 60c can be identical to the second reflective sheet 60b when the protruding portion 60t is cut out from the second reflective sheet 60b (see Ct of FIG. 19) and the second reflective sheet 60b is rotated by 180 degrees (see Rb of FIG. 19). After being rotated by 180 degrees (see Rb of FIG. 19), the second vertical side part 60Sb of the second reflective sheet 60b can be identical to the third vertical side part 60Sc of the third reflective sheet 60c. After being rotated by 180 degrees (see Rb of FIG. 19), the second horizontal side part 60Lb of the second reflective sheet 60b can be identical to the third horizontal side part 60Lc of the third reflective sheet 60c. Alternatively, the above side parts 60Sb, 60Lb, 60Sc, and 60Lc can be omitted, and the third reflective sheet 60c can be the same as the second reflective sheet 60b from which the protruding portion 60t is cut-out.

Accordingly, the second reflective sheet 60b and the third reflective sheet 60c can be manufactured using a single mold. The second reflective sheet 60b can also have the protruding portion 60t, and the protruding portion 60t can be removed by being cut out from another portion of the third reflective sheet 60c.

In this instance, the first to fourth reflective sheets 60a, 60b, 60c, and 60d (see FIGS. 15 to 20) can be reflective sheets which are partitioned into two types and four parts and formed by adding a cut-out process. In this instance, a sum of the number of holes 601 of the first to fourth reflective sheets 60a, 60b, 60c, and 60d can be an odd number. Meanwhile, even when a sum of the number of holes 601 of the first to fourth reflective sheets 60a, 60b, 60c, and 60d is an even number, two of the four reflective sheets can be manufactured using a single mold, in which any one thereof can be identical to the other from which the protruding portion is cut out.

Figure 21:
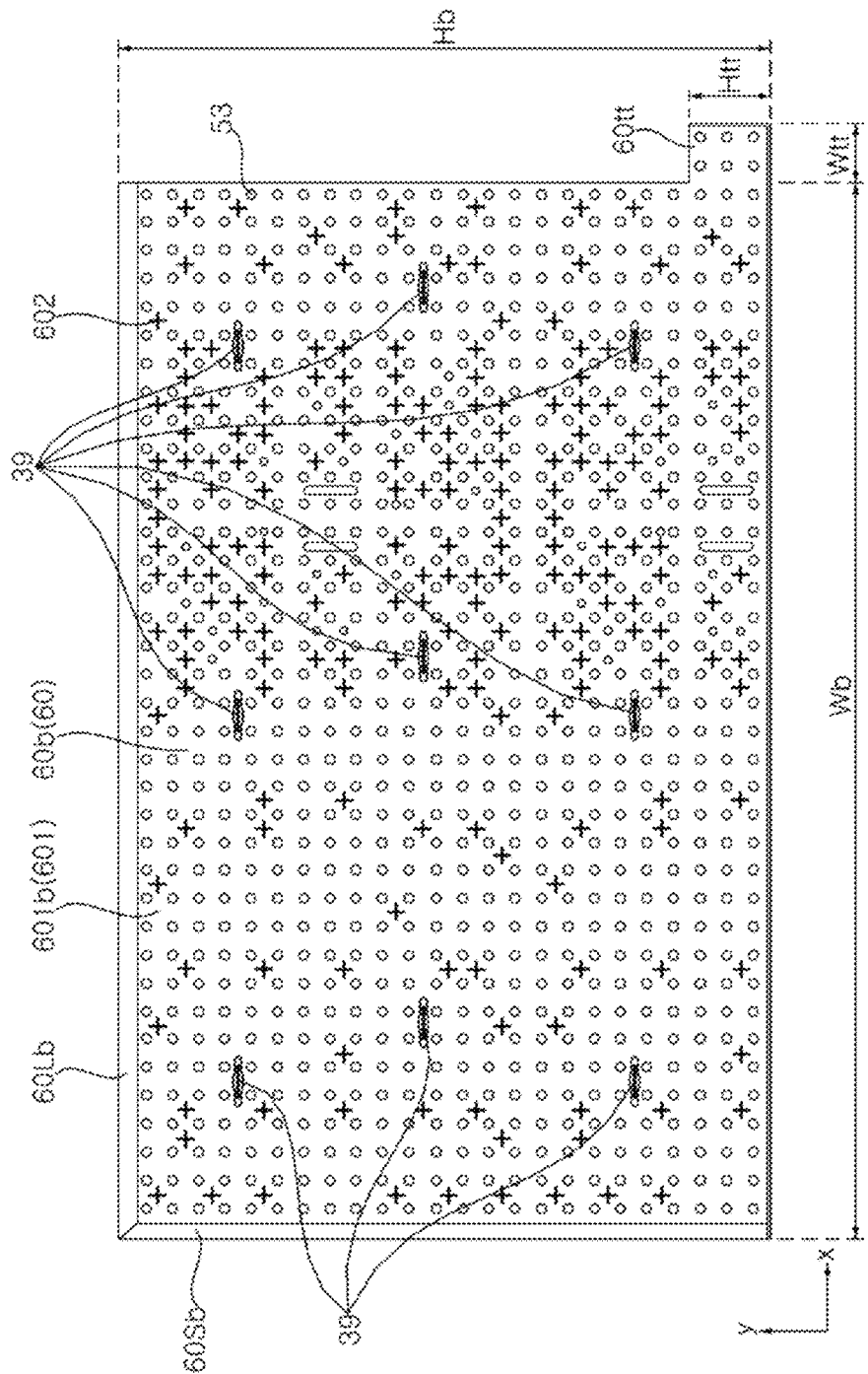

Referring to FIG. 21, a protruding portion 60tt can protrude leftward from the left side of the second reflective sheet 60b and can be adjacent to a lower side of the second reflective sheet 60b. The protruding portion 60tt can have a predetermined width Wtt and height Htt. Like other portions of the second reflective sheet 60b, the protruding portion 60tt as a reflective sheet can include a reflective material and can have holes 601b in which the lenses 53 are disposed. The number of holes 601b of the protruding portion 60tt can be an even number (e.g., six).

In addition, the second reflective sheet 60b and the third reflective sheet can be manufactured using a single mold. The second reflective sheet 60b can have the protruding portion 60tt, and the protruding portion 60tt can be removed by being cut out from another portion of the third reflective sheet.

Figure 22:
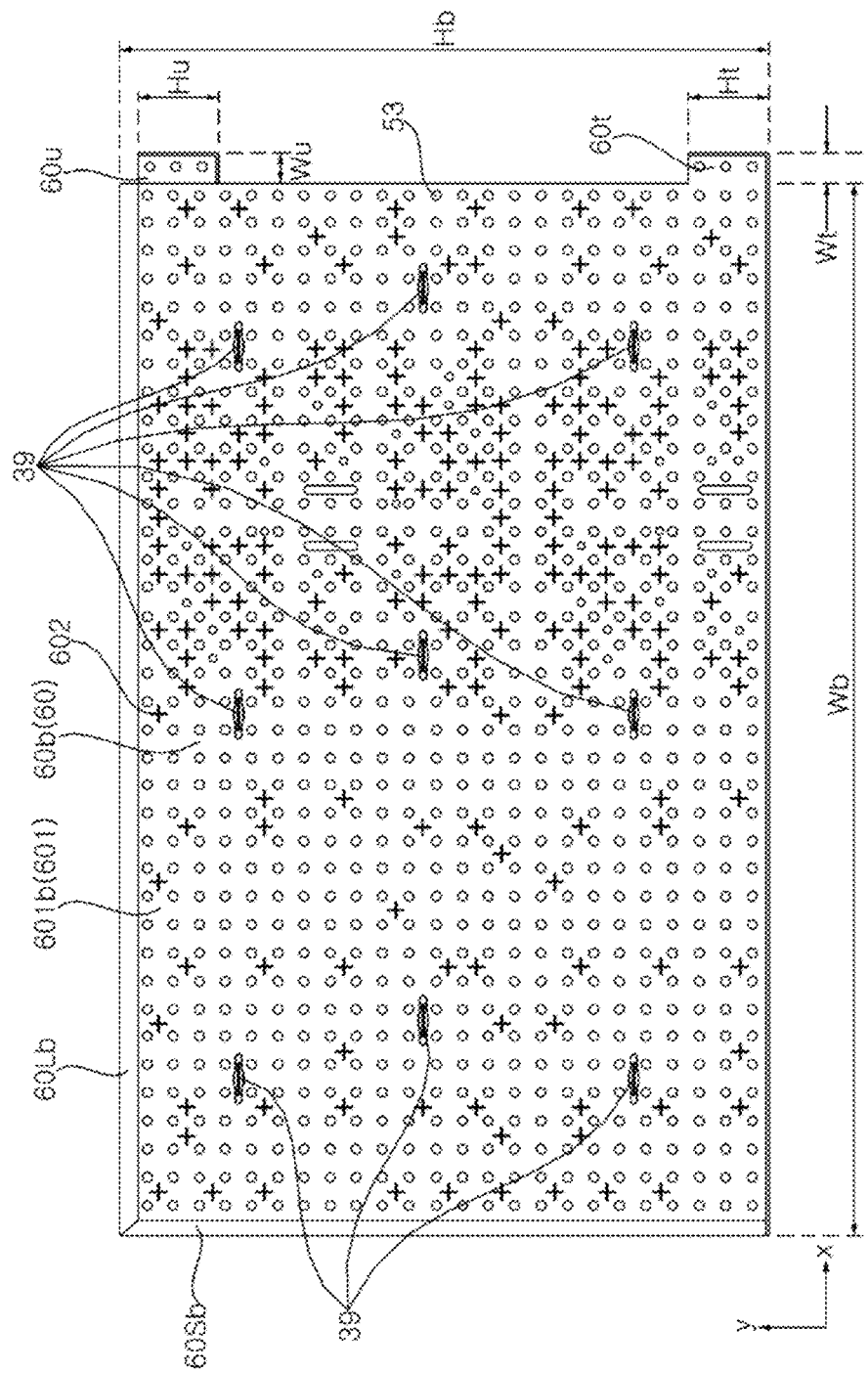

Referring to FIG. 22, a first protruding portion 60t and a second protruding portion 60u can protrude leftward from the left side of the second reflective sheet 60b. The first protruding portion 60t can be adjacent to the lower side of the second reflective sheet 60b, and the second protruding portion 60u can be adjacent to the upper side of the second reflective sheet 60b. In addition, the first protruding portion 60t can have a predetermined width Wt and height Ht, and the second protruding portion 60u can have a predetermined width Wu and height Hu. Like other portions of the second reflective sheet 60b, the first and second protruding portion 60t and 60u as reflective sheets can include a reflective material and can have holes 601b in which the lenses 53 are disposed. The number of each of the first and second protruding portions 60t and 60u can be an odd number (e.g., three) or an even number. Also, the first and second protruding portions 60t and 60u can have the same shape or different shapes.

In addition, the second reflective sheet 60b and the third reflective sheet can be manufactured using a single mold. The second reflective sheet 60b can have the first and second protruding portions 60t and 60u, and at least one of the protruding portions 60t and 60u can be removed by being cut out from another portion of the third reflective sheet.

Figure 23:
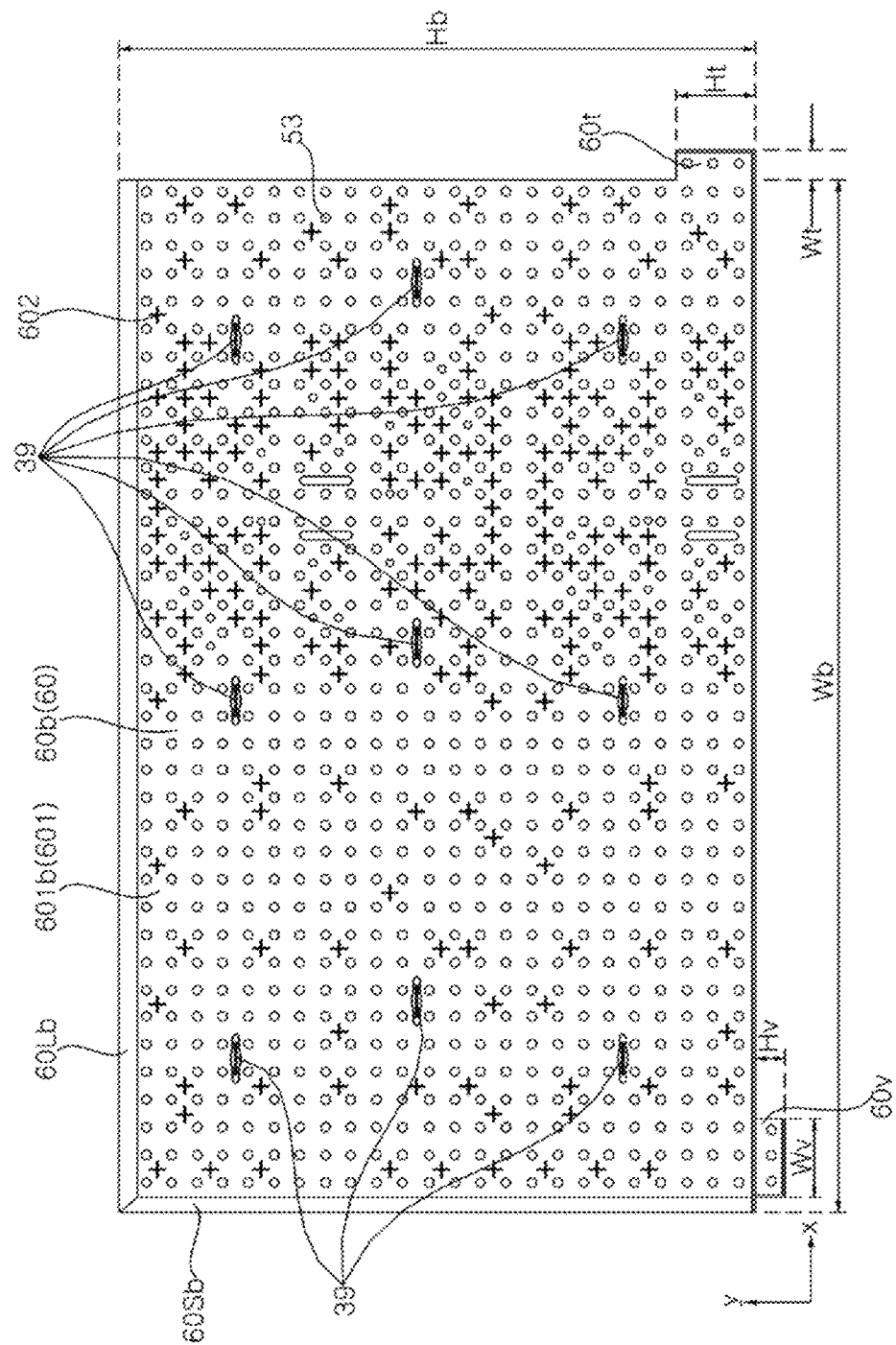

Referring to FIG. 23, a first protruding portion 60t can protrude leftward from the left side of the second reflective sheet 60b and can be adjacent to the lower side of the second reflective sheet 60b. A second protruding portion 60v can protrude downward from the lower side of the second reflective sheet 60b and can be adjacent to the right side of the second reflective sheet 60b. In addition, the first protruding portion 60t can have a predetermined width Wt and height Ht, and the second protruding portion 60v can have a predetermined width Wv and height Hv. Like other portions of the second reflective sheet 60b, the first and second protruding portion 60t and 60v as reflective sheets can include a reflective material and can have holes 601b in which the lenses 53 are disposed. The number of each of the first and second protruding portions 60t and 60v can be an odd number (e.g., three) or an even number. The first and second protruding portions 60t and 60v can have the same shape or different shapes.

Further, the second reflective sheet 60b and the third reflective sheet can be manufactured using a single mold. The second reflective sheet 60b can have the first and second protruding portions 60t and 60v, and at least one of the protruding portions 60t and 60v can be removed by being cut out from another portion of the third reflective sheet.

Figure 24:
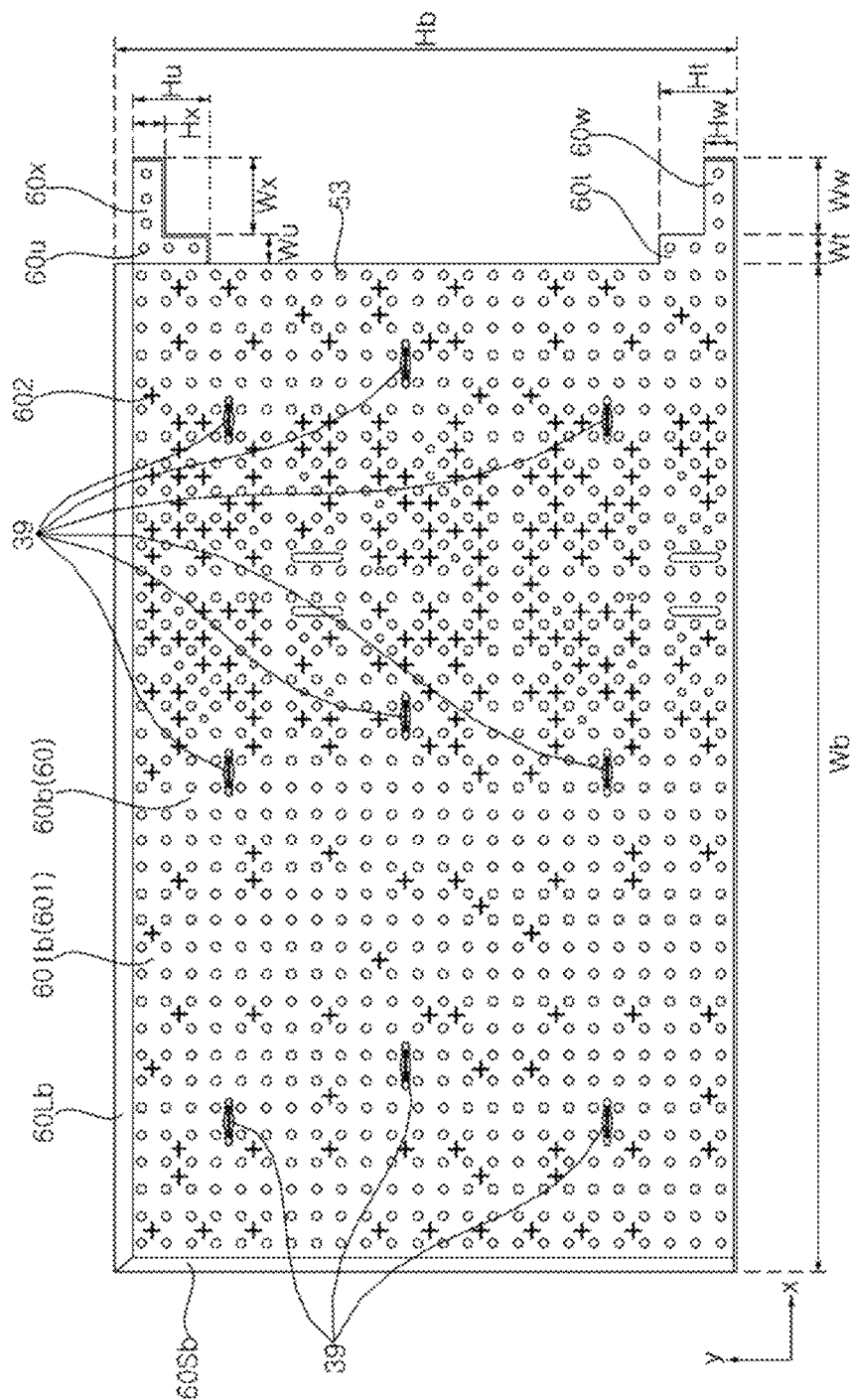

Referring to FIG. 24, a third protruding portion 60w can protrude from the first protruding portion 60t and can have a width Ww and a height Hw which are equal to or different from those of the first protruding portion 60t. A fourth protruding portion 60x can protrude from the second protruding portion 60u and can have a width Wx and a height Hx which are equal to or different from those of the second protruding portion 60u. Like other portions of the second reflective sheet 60b, the third and fourth protruding portions 60w and 60x as reflective sheets can include a reflective material and can have holes 601b in which the lenses 53 are disposed. In addition, the number of each of the third and fourth protruding portions 60w and 60x can be an odd number (e.g., three) or an even number. The third and fourth protruding portions 60w and 60x can have the same shape or different shapes.

Also, the second reflective sheet 60b and the third reflective sheet can be manufactured using a single mold. The second reflective sheet 60b can have the first to fourth protruding portions 60t, 60u, 60w, and 60x, and at least one of the first to fourth protruding portions 60t, 60u, 60w, and 60x can be removed by being cut out from another portion of the third reflective sheet.

Figure 25:
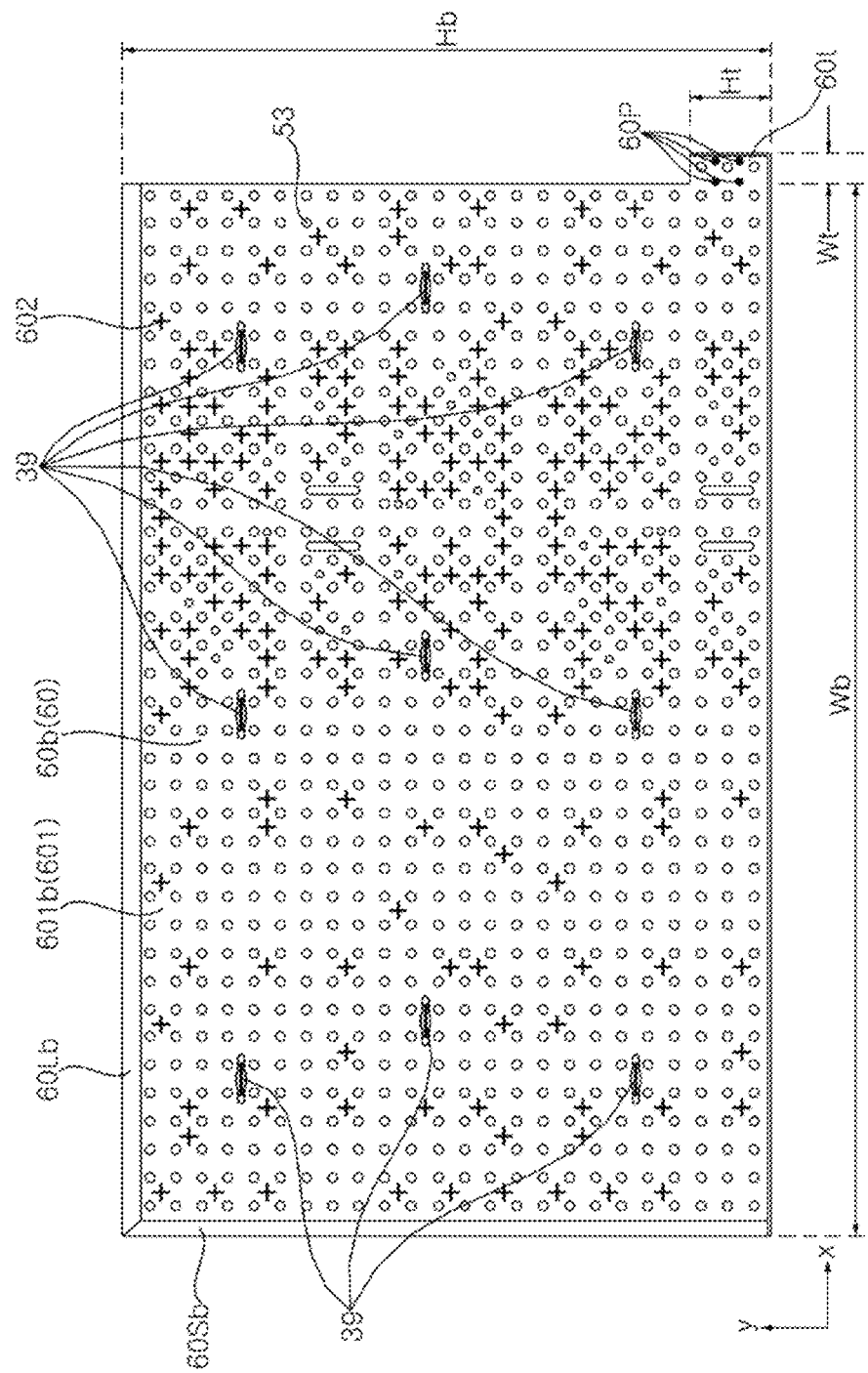
Figure 26:
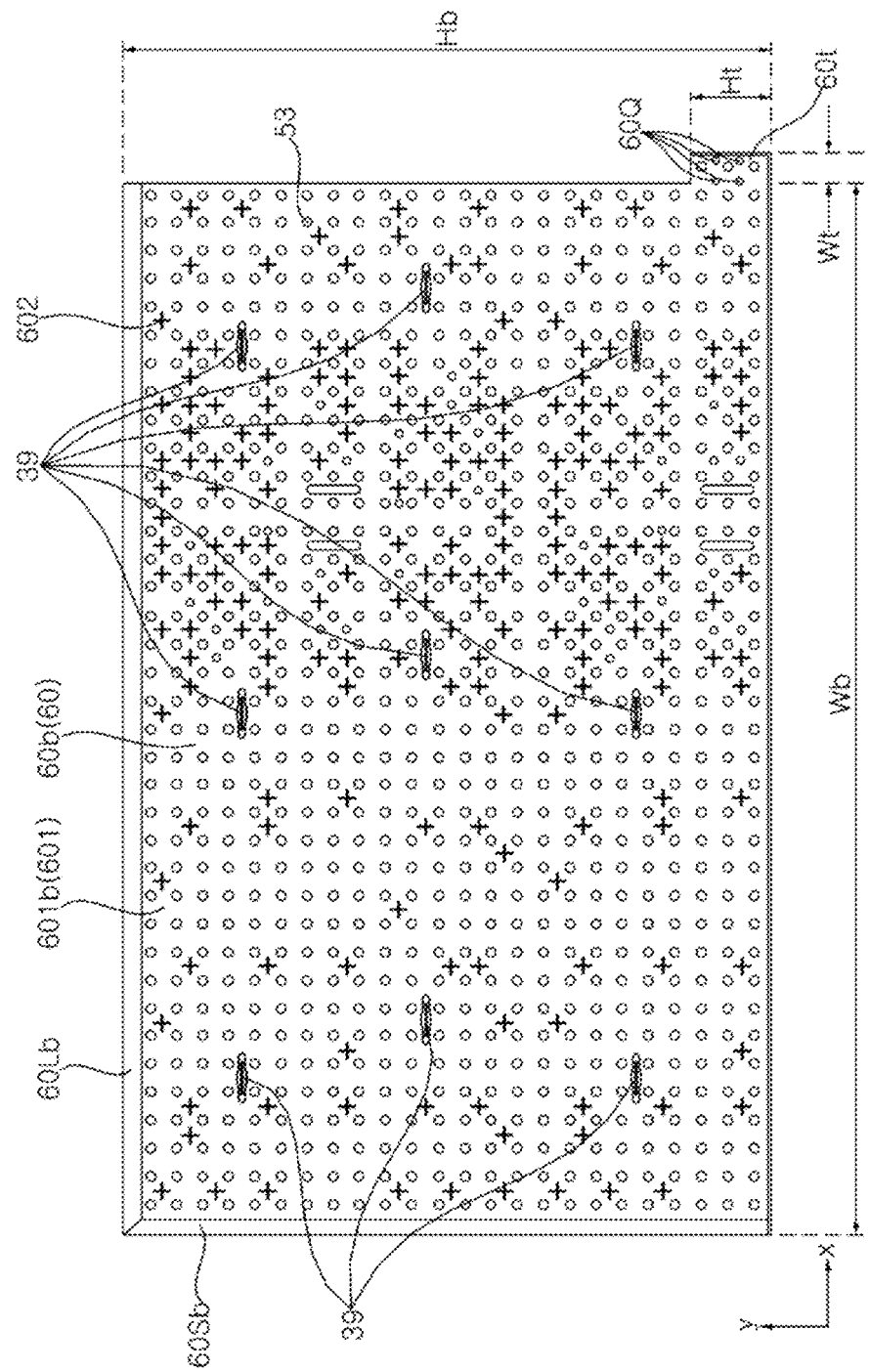
Figure 27:
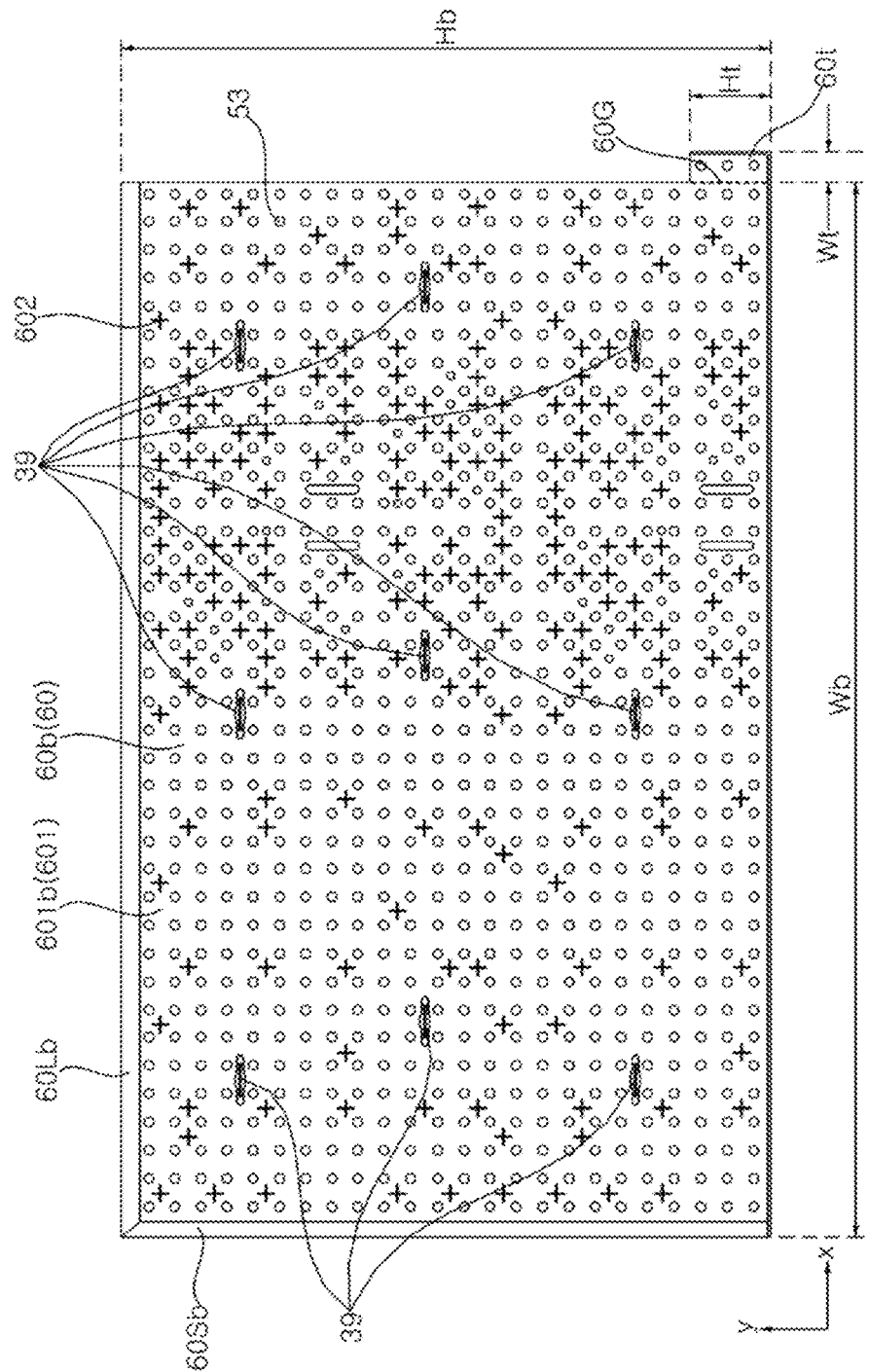

Referring to FIG. 25, a dot(s) 60P can be formed on the surface of the protruding portion 60t. The dot 60P can be a black or white printed layer. Referring to FIG. 26, a dot(s) 60Q can be formed on the surface of the protruding portion 60t. The dot 60P can be a fluorescent printed layer. Referring to FIG. 27, a guide line 60G can be formed at a boundary between the protruding portion 60t and another portion of the second reflective sheet 60b. The guide line 60G can be a black and white printed layer with dotted lines. An operator or robot can cut out the protruding portion 60t from another portion of the second reflective sheet 60b along the guide line 60G.

Figure 28:
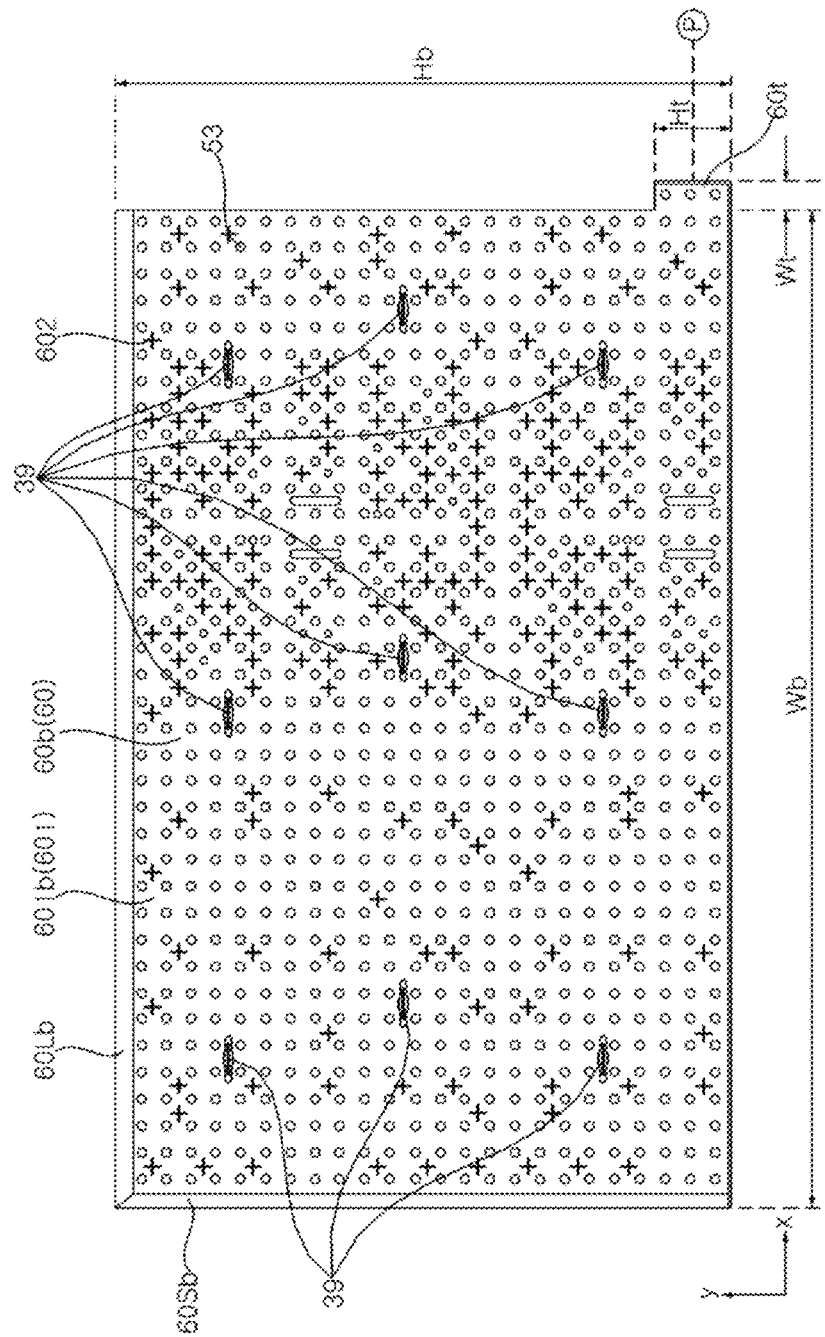
Figure 29:
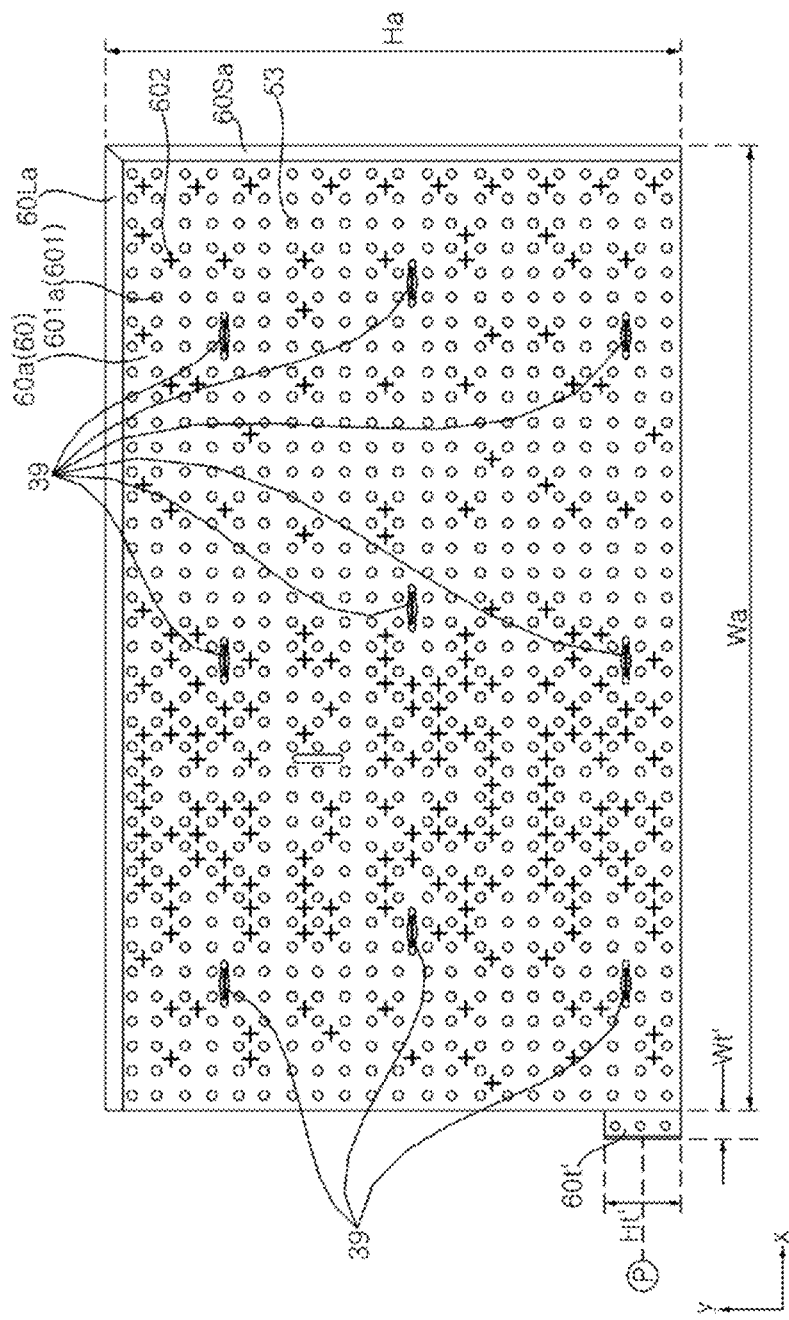

Referring to FIGS. 28 and 29, a protruding portion 60t' can protrude rightward from a right side of the first reflective sheet 60a and can be adjacent to a lower side of the first reflective sheet 60a. In addition, the protruding portion 60t' can have a predetermined width Wt' and height Ht'.

The protruding portion 60t' of the first reflective sheet 60a can overlap the protruding portion 60t of the second reflective sheet 60b (see P of FIGS. 28 and 29). In this instance, the protruding portion 60t' can be cut out from another portion of the first reflective sheet 60a, and the protruding portion 60t can be cut out from another portion of the second reflective sheet 60b.

Referring to FIGS. 1 to 29, a display device according to an aspect of the present disclosure can include a display panel; a frame disposed at a rear of the display panel; a substrate disposed between the display panel and the frame and coupled to the frame; light sources positioned on the substrate; and a reflective sheet covering the substrate and having holes equal in number to the light sources, wherein the reflective sheet may include: a first reflective sheet having first holes which are some of the holes, the first reflective sheet including a protruding portion protruding from one side of the first reflective sheet and having some of the first holes; and a second reflective sheet having second holes which are some of the holes, wherein the second reflective sheet is identical to the first reflective sheet from which the protruding portion is cut out. The first reflective sheet and the second reflective sheet may not overlap each other in a front-rear direction. A number of holes of the reflective sheet may be an odd number; and a number of second holes of the second reflective sheet may be equal to a number obtained by subtracting the number of first holes, formed in the protruding portion, from the number of first holes of the first reflective sheet.

The number of first holes formed in the protruding portion may be an odd number. The number of first holes of the first reflective sheet may be an odd number, and the number of second holes of the second reflective sheet may be an even number. The number of first holes of the first reflective sheet may be an even number, and the number of second holes of the second reflective sheet may be an odd number. The protruding portion may include a plurality of protruding portions that are spaced apart from each other along the one side of the first reflective sheet.

The protruding portion may include: a first protruding portion protruding from the one side of the first reflective sheet; and a second protruding portion protruding from another side of the first reflective sheet. The reflective sheet may include: a third reflective sheet having third holes which are part of the holes; and a fourth reflective sheet having fourth holes which are part of the holes and having a same shape as the third reflective sheet, wherein the first to fourth reflective sheets may be next to each other. The first reflective sheet may be adjacent to a right side and an upper side of the frame; the second reflective sheet may be adjacent to a left side and a lower side of the frame; the third reflective sheet may be adjacent to the left side and the upper side of the frame; and the fourth reflective sheet may be adjacent to the right side and the lower side of the frame, wherein a boundary between the first reflective sheet and the third reflective sheet may be horizontally spaced apart from a boundary between the second reflective sheet and the fourth reflective sheet.

The second reflective sheet may be rotated with respect to the frame by a same angle as that of the first reflective sheet, from which the protruding portion is cut out, or by 180 degrees. The first reflective sheet may include a side part bent forward from another side of the first reflective sheet. The first reflective sheet may include a guide line formed at a boundary between the protruding portion and another portion of the first reflective sheet.

The first reflective sheet may include a printed layer formed on a surface of the protruding portion. The display device may further include lenses covering the light sources and fixed on the substrate, wherein the lenses may be positioned at the holes of the reflective sheet. The display device according to the present disclosure has the following effects.

According to at least one of the embodiments of the present disclosure, a structure that allows common use of reflective sheets is provided. Further provided is a structure that allows common use of a mold for manufacturing reflective sheets even when the number of light sources on a substrate is an odd number. Also provided is a structure in which reflective sheets overlap each other, thereby preventing any one thereof from being lifted from another. In addition, various examples of a protruding portion which is cut out for common use of reflective sheets is also provided.

Certain embodiments or other embodiments of the invention described above are not mutually exclusive or distinct from each other. Any or all elements of the embodiments of the invention described above may be combined or combined with each other in configuration or function. For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

The foregoing embodiments are merely examples and are not to be considered as limiting the present disclosure. The scope of the present disclosure should be determined by rational interpretation of the appended claims, and all modifications within the equivalents of the disclosure are intended to be included within the scope of the present disclosure.

What is claimed is:

1. A display device comprising:
    a display panel;
    a frame disposed at a rear of the display panel;
    a substrate disposed between the display panel and the frame and coupled to the frame;
    light sources disposed on the substrate; and
    a reflective sheet covering the substrate and having a plurality of holes equal corresponding to the light sources,
    wherein the reflective sheet comprises:
        a first reflective sheet having first holes among the plurality of holes, and a protruding portion protruding from one side of the first reflective sheet including some of the first holes; and
        a second reflective sheet having second holes among the plurality of holes,
    wherein the second reflective sheet is identical to the first reflective sheet except for the protruding portion.

2. The display device of claim 1, wherein the first reflective sheet and the second reflective sheet, do not overlap each other in a front-rear direction.

3. The display device of claim 1, wherein:
    a total number of holes of the reflective sheet is an odd number; and
    a total number of the second holes of the second reflective sheet is equal to a number of the first holes of the first reflective sheet excluding the some of the first holes disposed on the protruding portion.

4. The display device of claim 1, wherein a number of the some of the first holes formed in the protruding portion is an odd number.

5. The display device of claim 4, wherein a total number of the first holes of the first reflective sheet is an odd number, and a total number of the second holes of the second reflective sheet is an even number.

6. The display device of claim 4, wherein a total number of the first holes of the first reflective sheet is an even number, and a total number of the second holes of the second reflective sheet is an odd number.

7. The display device of claim 1, wherein the protruding portion comprises a plurality of protruding portions, the plurality of protruding portions being spaced apart from each other.

8. The display device of claim 1, wherein the protruding portion comprises:
    a first protruding portion protruding from the one side of the first reflective sheet; and
    a second protruding portion protruding from a different side of the first reflective sheet.

9. The display device of claim 1, further comprising:
    a third reflective sheet having third holes among the plurality of holes; and
    a fourth reflective sheet having fourth holes, and
    wherein the first to fourth reflective sheets are disposed next to each other.

10. The display device of claim 9, wherein:
    the first reflective sheet is adjacent to a right side and an upper side of the frame,
    the second reflective sheet is adjacent to a left side and a lower side of the frame,
    the third reflective sheet is adjacent to the left side and the upper side of the frame, and
    the fourth reflective sheet is adjacent to the right side and the lower side of the frame,
    wherein a boundary between the first reflective sheet and the third reflective sheet is horizontally spaced apart from a boundary between the second reflective sheet and the fourth reflective sheet.

11. The display device of claim 1, wherein the second reflective sheet is rotated with respect to the frame by a same angle as that of the first reflective sheet, from which the protruding portion is cut out, or by 180 degrees.

12. The display device of claim 11, wherein the first reflective sheet further comprises a side part bent forward at at least one side of the first reflective sheet.

13. The display device of claim 1, wherein the first reflective sheet further comprises a guide line formed at a boundary between the protruding portion and another portion of the first reflective sheet.

14. The display device of claim 1, wherein the first reflective sheet further comprises a printed layer formed on a surface of the protruding portion.

15. The display device of claim 1, further comprising lenses covering the light sources, and
wherein the lenses are fixed on the substrate, and
wherein the lenses are positioned at the holes of the reflective sheet.

16. A display device comprising:
a display panel;
a frame disposed at a rear of the display panel;
a substrate disposed between the display panel and the frame, the substrate being coupled to the frame;
light sources disposed on the substrate; and
a reflective sheet covering the substrate and having holes, the holes corresponding to the light sources,
wherein the reflective sheet comprises:
a first reflective sheet disposed adjacent to a right side and an upper side of the frame having first holes,
a second reflective sheet adjacent to a left side and a lower side of the frame sheet having second holes;
a third reflective sheet adjacent to the left side and the upper side of the frame having third holes; and
a fourth reflective sheet adjacent to the right side and the lower side of the frame having fourth holes, and
wherein a boundary between the first reflective sheet and the fourth reflective sheet is vertically spaced apart from a boundary between the second reflective sheet and the third reflective sheet.

17. The display device of claim 16, wherein the first reflective sheet comprises a protruding portion protruding from one side of the first reflective sheet including some of the first holes.

18. The display device of claim 17, wherein a number of holes of the reflective sheet is an odd number,
a number of holes of the second reflective sheet is equal to a number of holes of the first reflective sheet excluding the some of the first holes disposed on the protruding portion, and
a number of holes of the third reflective sheet is equal to a number of holes of the fourth reflective sheet.

19. The display device of claim 16, wherein the reflective sheet is attached to the substrate by an adhesive member.

20. The display device of claim 19, wherein the light sources pass through holes of the adhesive member.

\* \* \* \* \*